US009021611B2

(12) United States Patent
Mirkin et al.

(10) Patent No.: US 9,021,611 B2
(45) Date of Patent: Apr. 28, 2015

(54) BEAM PEN LITHOGRAPHY

(75) Inventors: Chad A. Mirkin, Wilmette, IL (US);
Gengfeng Zheng, Ambler, PA (US);
Fengwei Huo, Evanston, IL (US)

(73) Assignee: Northwestern University, Evanston, IL (US)

( * ) Notice: Subject to any disclaimer, the term of this patent is extended or adjusted under 35 U.S.C. 154(b) by 75 days.

(21) Appl. No.: 13/202,142

(22) PCT Filed: Feb. 18, 2010

(86) PCT No.: PCT/US2010/024633
§ 371 (c)(1),
(2), (4) Date: Aug. 18, 2011

(87) PCT Pub. No.: WO2010/096593
PCT Pub. Date: Aug. 26, 2010

(65) Prior Publication Data
US 2011/0305996 A1    Dec. 15, 2011

Related U.S. Application Data

(60) Provisional application No. 61/153,400, filed on Feb. 18, 2009, provisional application No. 61/153,389, filed on Feb. 18, 2009.

(51) Int. Cl.
*G03F 7/20*    (2006.01)

(52) U.S. Cl.
CPC .......... *G03F 7/2051* (2013.01); *G03F 7/70291* (2013.01); *G03F 7/70383* (2013.01); *G03F 7/70466* (2013.01); *G03F 7/70525* (2013.01); *G03F 7/70958* (2013.01)

(58) Field of Classification Search
CPC ....... G01Q 60/22; G01Q 60/06; G01Q 60/18; H01J 37/09

USPC ................................................ 850/55, 57, 58
See application file for complete search history.

(56) References Cited

U.S. PATENT DOCUMENTS 5,166,520 A *  11/1992  Prater et al. ..................... 850/57
5,294,790 A *   3/1994  Ohta et al. ..................... 250/216
(Continued)

FOREIGN PATENT DOCUMENTS

JP    11-016856 A    1/1999
JP    11-064350 A    3/1999
(Continued)

OTHER PUBLICATIONS

JACS Communications Published on Web Mar. 18, 2003 A Photocurable Poly(dimethylsiloxane) Chemistry Designed for Soft Lithographic Molding and Printing in the Nanometer Regime, Kyung M. Choi and John A. Rogers Bell Laboratories, Lucent Technologies, Murray Hill, New Jersey 07974.*

(Continued)

*Primary Examiner* — Phillip A Johnston
*Assistant Examiner* — Sean Luck
(74) *Attorney, Agent, or Firm* — Marshall, Gerstein & Borun LLP

(57) ABSTRACT

The disclosure relates to methods of beam pen lithography using a tip array having a plurality of transparent, elastomeric, reversibly-deformable tips coated with a blocking layer and apertures defined in the blocking layer to expose tip ends of the tips in the array. The tip array can be used to perform a photolithography process in which the tips are illuminated with a radiation that is channeled through the tips and out the apertures to expose a photosensitive substrate. Also disclosed are tip arrays formed of polymers and gels, apparatus including the tip arrays and radiation sources, and related apparatus for selectively masking tips in the tip array from radiation emitted from the radiation source.

50 Claims, 27 Drawing Sheets

(56) References Cited

U.S. PATENT DOCUMENTS

| | | | |
|---|---|---|---|
| 5,776,748 | A | 7/1998 | Singhvi et al. |
| 5,859,937 | A * | 1/1999 | Nomura ............................ 385/12 |
| 6,156,215 | A * | 12/2000 | Shimada et al. ................ 216/11 |
| 6,236,033 | B1 * | 5/2001 | Ebbesen et al. ................ 250/216 |
| 6,339,217 | B1 * | 1/2002 | Kley ............................... 250/216 |
| 6,376,833 | B2 * | 4/2002 | Shimada et al. ............... 250/234 |
| 6,445,453 | B1 * | 9/2002 | Hill ................................. 356/450 |
| 6,455,334 | B1 * | 9/2002 | Goruganthu et al. ............ 438/14 |
| 6,479,816 | B1 * | 11/2002 | Oumi et al. ....................... 850/30 |
| 6,500,549 | B1 | 12/2002 | Deppisch et al. |
| 6,596,346 | B2 | 7/2003 | Bernard et al. |
| 6,768,095 | B2 * | 7/2004 | Niwa et al. ..................... 250/216 |
| 6,794,296 | B1 * | 9/2004 | Kassing et al. ................. 438/706 |
| 2001/0011704 | A1 * | 8/2001 | Niwa et al. ..................... 250/310 |
| 2001/0030938 | A1 * | 10/2001 | Oumi et al. ..................... 369/300 |
| 2002/0024004 | A1 * | 2/2002 | Shimada et al. ............... 250/216 |
| 2002/0154859 | A1 * | 10/2002 | Kuroda et al. ................... 385/31 |
| 2003/0068446 | A1 * | 4/2003 | Mirkin et al. ................. 427/430.1 |
| 2003/0085351 | A1 * | 5/2003 | Nakajima et al. ............. 250/306 |
| 2005/0013536 | A1 * | 1/2005 | Walt ................................. 385/27 |
| 2005/0191774 | A1 * | 9/2005 | Li et al. ............................ 438/22 |
| 2005/0253290 | A1 * | 11/2005 | Yokoyama et al. ............. 264/1.1 |
| 2006/0192115 | A1 * | 8/2006 | Thomas et al. ................. 250/306 |
| 2007/0125969 | A1 * | 6/2007 | Schellenberg et al. ... 250/504 R |
| 2007/0281130 | A1 * | 12/2007 | D'Urso et al. ................. 428/156 |
| 2008/0078239 | A1 * | 4/2008 | Ko et al. .......................... 73/105 |
| 2013/0040856 | A1 * | 2/2013 | Mirkin et al. ................... 506/11 |

FOREIGN PATENT DOCUMENTS

| | | | |
|---|---|---|---|
| JP | 2003-305700 A | | 10/2003 |
| KR | 1020070063318 | * | 6/2007 |

OTHER PUBLICATIONS

Jounral of Microscopy, col. 186. Pt 1, Apr. 1997, pp. 17-22 Munster et al "Novel micromachined cantilever sensors for scanning near-field optical microscopy".*

International Search Report and Written Opinion for corresponding International Application No. PCT/US2010/024633, mailing date Oct. 19, 2010.

Abbe et al., Beiträge zur Theorie des Mikroskops und der mikroskopischen Wahrnehmung, Arch. mikrosk. Anat. Entwichlungsmech., 9, 413-68 (1873).

Andrew et al., Confining light to deep subwavelength dimensions to enable optical nanopatterning, Science, 324:917-21 (2009).

Bullen et al., Electrostatically actuated dip pen nanolithography probe arrays, Sensors and Actuators A: Physical, 125:504-11 (2006).

Bullen et al., Parallel dip-pen nanolithography with arrays of individually addressable cantilevers, Appl. Phys. Lett., 84:789-91 (2004).

Choi et al., Modeling of a nanoscale oxide aperture opening for a NSOM probe, J. Korean Phys. Soc., 45:1659-63 (2004).

Donzel et al., Hydrophilic poly(dimethylsiloxane) stamps for microcontact printing, Adv. Mater., 13(15): 1164-7 (2001).

Gates et al., New approaches to nanofabrication: molding, printing, and other techniques, Chem. Rev., 105:1171-96 (2005).

Geissler et al., Patterning: principles and some new developments, Adv. Mater., 16:1249-69 (2004).

He et al., Preparation of hydrophilic poly(dimethylsiloxane) stamps by plasma-induced grafting, Langmuir, 19(17):6982-6 (2003).

Huo et al., Polymer pen lithography, Science, 321 (5896): 1658-60 (2008).

International Preliminary Report on Patentability from corresponding International Application No. PCT/US10/24633, mailing date Oct. 19, 2010.

International Search Report and Written Opinion from corresponding International Application No. PCT/US10/24633, mailing date Oct. 19, 2010.

Ito et al., Pushing the limits of lithography, Nature, 406:1027-31 (2000).

Kingsley et al., Optical nanolithography using a scanning near-field probe with an integrated light source, Appl. Phys. Lett., 93:213103 (2008).

Leggett, Scanning near-field photolithography—surface photochemistry with nanoscale spatial resolution, Chem. Soc. Rev., 35:1150-61 (2006).

Levenson et al., Improving resolution in photolithography with a phase-shifting mask, IEEE Trans. Electr. Dev., 29(12):1828-36 (1982).

Li et al., Achieving λ/20 resolution by one-color initiation and deactivation of polymerization, Science, 324:910-3 (2009).

Martin et al., Direct protein microarray fabrication using a hydrogel "stamper", Langmuir, 14(15):3971-5 (1998).

Mirkin, The power of the pen: development of massively parallel dip-pen nanolithography, *ACS Nano*, 1:79-83 (2007).

Naber et al., High-resolution lithography with near-field optical microscopy, Scanning, 18:567-71 (1996).

Piner et al., 'Dip-Pen' nanolithography, Science, 283:661-3 (1999).

Qi et al., A three-dimensional optical photonic crystal with designed point defects, Nature, 429:538-42 (2004).

Qin et al., Photolithography with transparent reflective photomasks, J. Vac. Sci. Technol. B, 16:98-103 (1998).

Qin et al., Elastomeric light valves, Adv. Mater., 9:407-10 (2004).

Salaita et al., Applications of dip-pen nanolithography, Nat. Nanotechnol., 2:145-55 (2007).

Schmid et al., Siloxane polymers for high-resolution, high-accuracy soft lithography, Macromolecules, 33(8):3042-9 (2000).

Scott et al., Two-color single-photon photoinitiation and photoinhibition for subdiffraction photolithography, Science, 324:913-7 (2009).

Smith, A proposal for maskless, zone-plate-array nanolithography, J. Vac. Sci. Technol. B, 14:4318-22 (1996).

Vettiger et al., The "Millipede"—more than thousand tips for future AFM storage, IBM J. Res. Dev., 44:323 (2000).

Wang et al., Thermally actuated probe array for parallel dip-pen nanolithography, J. Vac. Sci. Technol. B, 22:2563-7 (2004).

Zheng et al., Multiplexed protein arrays enabled by polymer pen lithography: addressing the inking challenge, Angew. Chem. Int. Ed., 48:7626-9 (2009).

* cited by examiner

BEAM PEN LITHOGRAPHY

CROSS-REFERENCE TO RELATED APPLICATIONS

The benefit under 35 U.S.C. §119(e) of U.S. Provisional Application Ser. No. 61/153,400, filed Feb. 18, 2009, and U.S. Provisional Patent Application Ser. No. 61/153,389, filed Feb. 18, 2009, is hereby claimed, and their entire disclosures are incorporated herein by reference.

STATEMENT OF GOVERNMENTAL INTEREST

This invention was made with U.S. government support under Grant No. EEC-0647560 awarded by the National Science Foundation (NSF/NSEC), Grant No. FA9550-08-0124 awarded by the U.S. Air Force Office of Scientific Research (AFOSR), and Grant No. N66001-08-2044 awarded by the Defense Advanced Research Projects Agency (DARPA). The government has certain rights in this invention.

BACKGROUND

The demand for nanoscale components in integrated circuits, medical diagnostics, and optoelectronics has generated much interest in the development and study of various lithography strategies (1-5). With conventional far-field optical lithography, however, lateral feature resolution is diffraction-limited, as defined by the Rayleigh or Abbé conditions, which in practical terms only allow feature dimensions of approximately half the incident wavelength (6). In order to overcome the diffraction limit, a number of lithography approaches have been reported, including multi-photon induced photoresist polymerization (7-9), zone-plate array lithography (10, 11), and phase-shift photolithography (12). Though these techniques are highly parallel, they rely on non-standard optical instrumentation and light sources not readily available to most researchers, or preclude arbitrary nanoscale pattern formation. In order to produce complex patterns, established approaches including electron-beam lithography, focused ion beam (FIB) lithography, and scanning probe microscopy (SPM)-based techniques such as dip-pen nanolithography (DPN) (13, 14) have been employed. Near-field scanning optical microscopy (NSOM)-based techniques and scanning near-field photolithography (SNP) are promising custom lithographic methods for sub-diffraction limit patterning, but are inherently low throughput and restricted to scan areas several hundred microns in length (15-17).

In order to generate sub-diffraction limit features, SNP optics rely on the evanescent field of incident light passing through an aperture, the intensity of which is strongly dependent on the distance between this aperture and the surface. To control precise aperture heights and lateral registry, SNP relies on feedback systems used in piezo-controlled SPM instruments (17). Though highly parallel two-dimensional (2D) silicon-based NSOM aperture arrays have been fabricated (18), aligning a large area substrate surface with near-field proximity to this hard non-deformable aperture array remains challenging. As a result, no successful demonstrations of their use in homogeneous patterning have been reported.

Transparent PDMS stamps have been used to control light propagation in the context of surface patterning (20, 21). This approach does not allow for the fabrication of sub-diffraction limit features in arbitrary geometries.

SUMMARY

In one aspect, a method for sub-micron scale patterning includes contacting a photosensitive substrate with a tip array described herein. The tip array can include a tip substrate layer, a plurality of tips fixed to a first surface of the tip substrate layer and having a tip end disposed opposite the first surface, a blocking layer coated on the first surface of the substrate layer including the plurality of tips, and a plurality of apertures defined in the blocking layer exposing the tip ends of the plurality of tips. The tip substrate layer and the plurality of tips are at least translucent, e.g. permitting transmission of light of a desired wavelength for patterning. The tip substrate layer and plurality of tips preferably are elastomeric. The method further includes illuminating at least one tip of the tip array with radiation. The radiation is channeled through the transparent polymer and out the tip end exposed by the aperture, to expose a portion of the photosensitive substrate. The exposed portion of the photosensitive substrate can have a dot size (or line width) of preferably less than 1 µm.

In another aspect, a tip array includes a tip substrate layer comprising a first surface and an oppositely disposed second surface, a plurality of tips fixed to the first surface, the tips each comprising a tip end disposed opposite the first surface. The tip substrate layer and the plurality of tips are at least translucent, e.g. permitting transmission of light of a desired wavelength for patterning. The tip substrate layer and plurality of tips preferably are elastomeric. The tip array further includes a blocking layer coated on the plurality of tips and the first surface of the tip substrate and a plurality of apertures defined in the blocking layer exposing the tip ends of the plurality of tips.

In another aspect, a method of making a beam pen lithography tip array includes providing tip array comprising a tip substrate layer comprising a first surface, an oppositely disposed second surface, a plurality of tips fixed to the first surface, the tips each comprising a tip end disposed opposite the first surface, coating a blocking layer on the plurality of tips and the first surface; and forming an aperture in the blocking layer at the tip ends of the tips by removing a portion of the blocking layer.

The method can include forming the tip array by forming a master comprising an array of recesses in a substrate separated by lands, filling the recesses and covering the lands with a prepolymer mixture comprising a prepolymer and, optionally, a crosslinker, curing the prepolymer mixture to form a polymer structure, and separating the cured polymer structure from the master.

The method can include removing a portion of the blocking layer by any suitable method, including mechanical removal (e.g., fracturing or ion beam ablation), chemical removal, or a combination of mechanical and chemical operations. In one embodiment, the portion of the blocking layer can be removed by contacting the coated portion of the polymer structure to a surface coated with an adhesive, and then moving the coated polymer structure and adhesive surface away from each other to separate an adhered portion of the blocking layer from the cured polymer structure. In another embodiment, the portion of the blocking layer can be removed by coating an adhesive on the blocking layer, and removing at least a portion of the adhesive by contacting the coated polymer structure to a surface, wherein upon removal of the polymer structure from the surface, the contacted portion of the adhesive remains on the surface to define an opening in the adhesive, exposing a portion of the blocking layer. The coated polymer structure can then be etched to remove the exposed portion of the blocking layer and thereby expose a portion of the polymer structure.

Another aspect is a system for beam pen lithography that includes a radiation source for emitting a radiation in a path and a tip array as describe herein disposed in the path with the radiation being incident upon the tip substrate layer. The tip array can be operatively coupled to the radiation source.

DETAILED DESCRIPTION

Beam Pen Lithography (BPL) can allow for patterning of sub-micron features over large areas with flexible pattern design, convenient, selective pen tip addressability, and low fabrication cost. As compared to conventional photolithography or contact printing in which only pre-formed patterns (i.e. photomasks) can be duplicated, BPL can provide the flexibility to create different patterns by controlling the movement of a tip array 10 over the substrate and/or by selectively illuminating one or more of the pen tips 14 in the tip array 10. Thus, multiple "dots", for example, can be fabricated to achieve arbitrary features. This approach bypasses the need for, and costs associated with, photomask fabrication in conventional photolithography, allowing one to arbitrarily make many different types of structures without the hurdle of designing a new master via a throughput-impeded serial process.

Figure 1A:
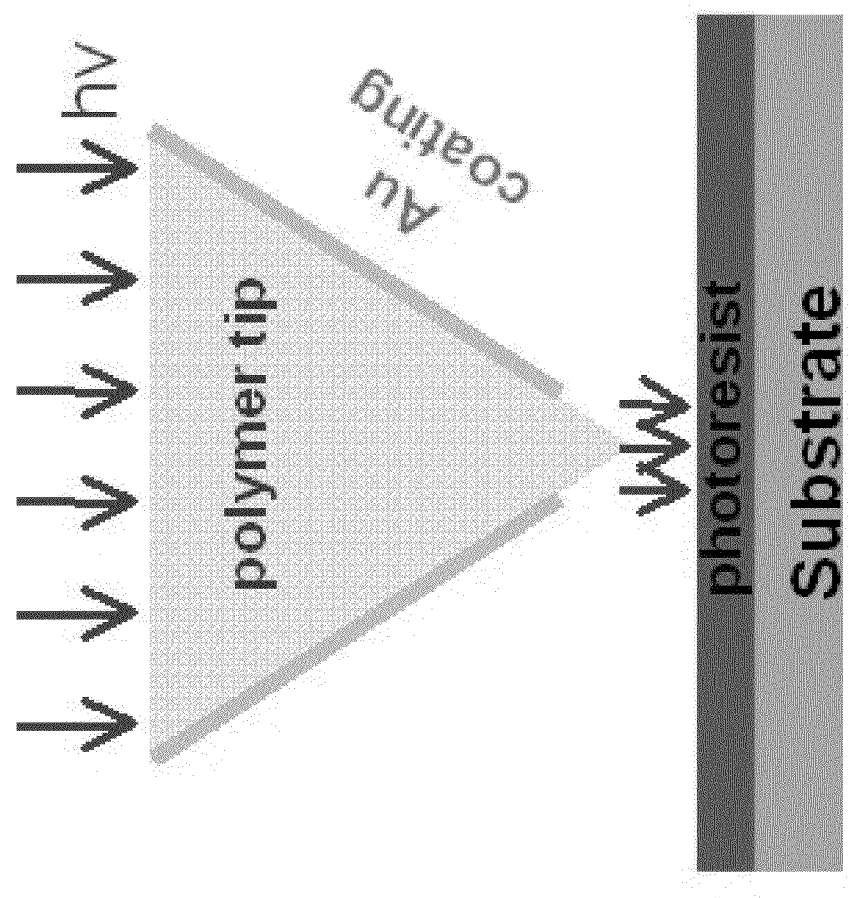
FIGS. 1A and 1B are schematic representations of a beam pen lithography method in accordance with an embodiment of the disclosure.
Figure 1B:
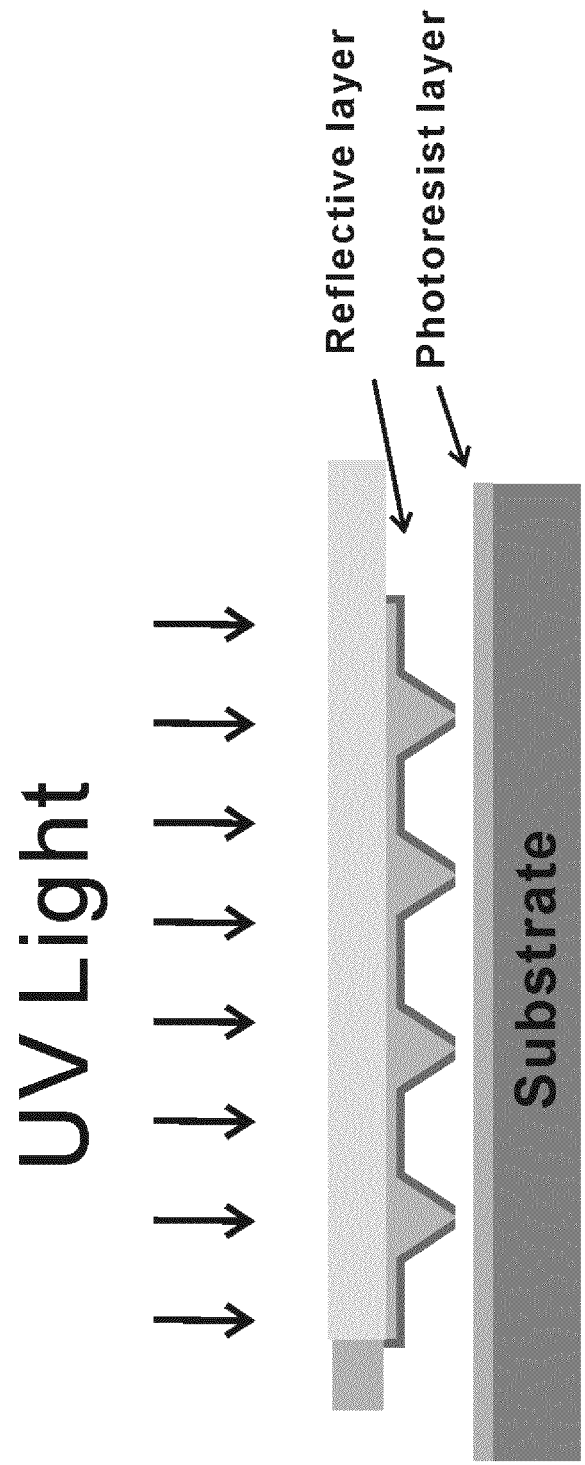

Referring to FIGS. 1A and 1B, an embodiment of BPL generally includes contacting a photosensitive substrate, for example, a substrate having a photosensitive layer 20 coated thereon with a tip array 10 and irradiating a surface of a tip array 10 with a radiation source, such as, for example, UV light. The tip array 10 includes a plurality of tips 14. The tips 14 are formed from a material which is at least translucent to the wavelength of radiation intended for use in patterning, e.g. in a range of 300 nm to 600 nm, and preferably the tips 14 are transparent to such light. Each tip can have a blocking layer 16 disposed thereon, with an aperture 18 defined in the blocking layer 16 and exposing the tip end. The blocking layer 16 serves as a radiation blocking layer 16, channeling the radiation through the material of the tip and out the exposed tip end. The tips 14 can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips 14 are elastomeric and reversibly deformable, which can allow the tip array 10 to be brought in contact with the substrate without damage to the substrate or the tip array 10. This contact can ensure the generation of near-field effects.

BPL Tip Array

Figure 2A:
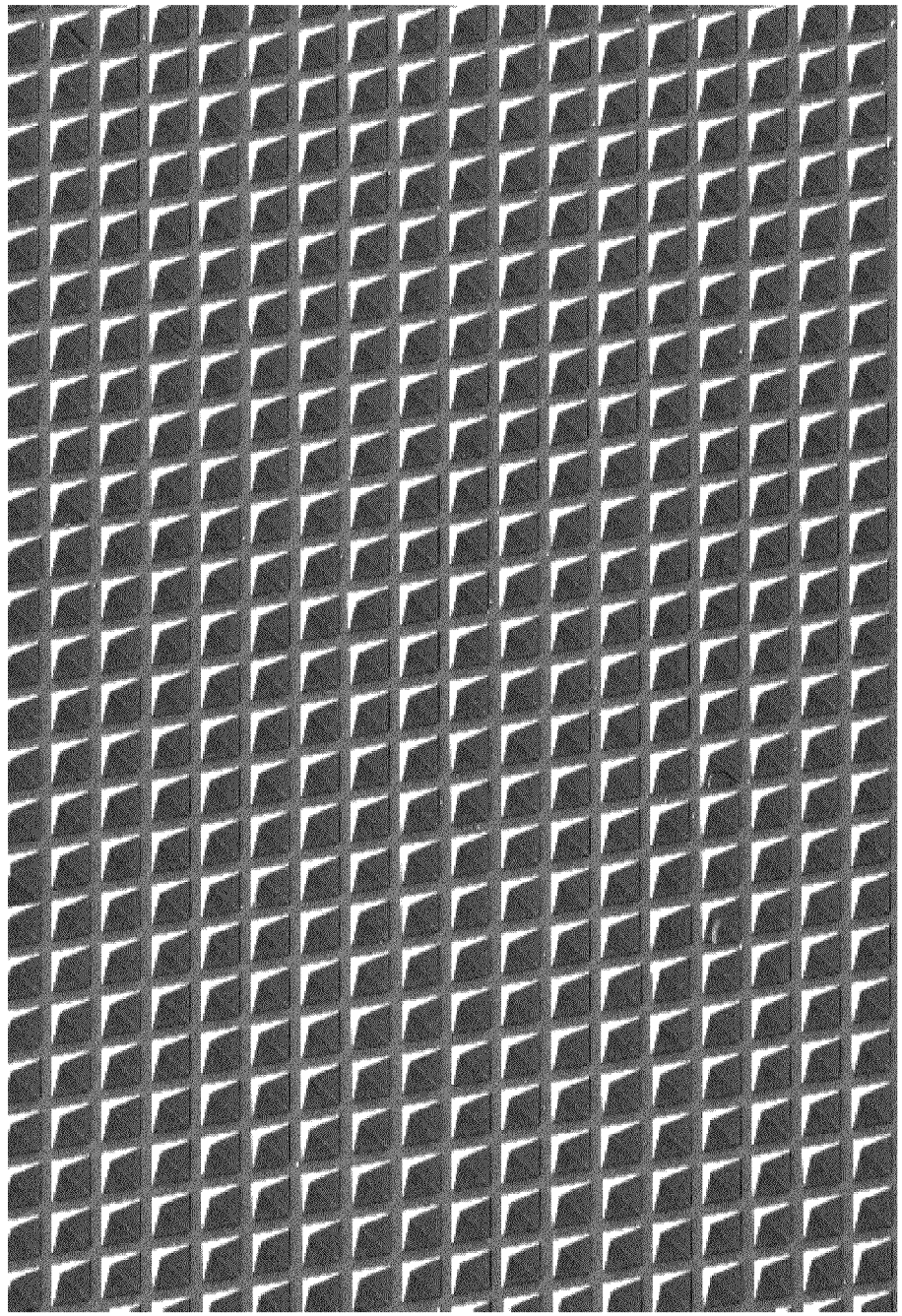
FIG. 2A is an SEM image of a portion of a large scale (approximately 15,000 pens) polymer pen tip array embodiment.
Figure 2B:
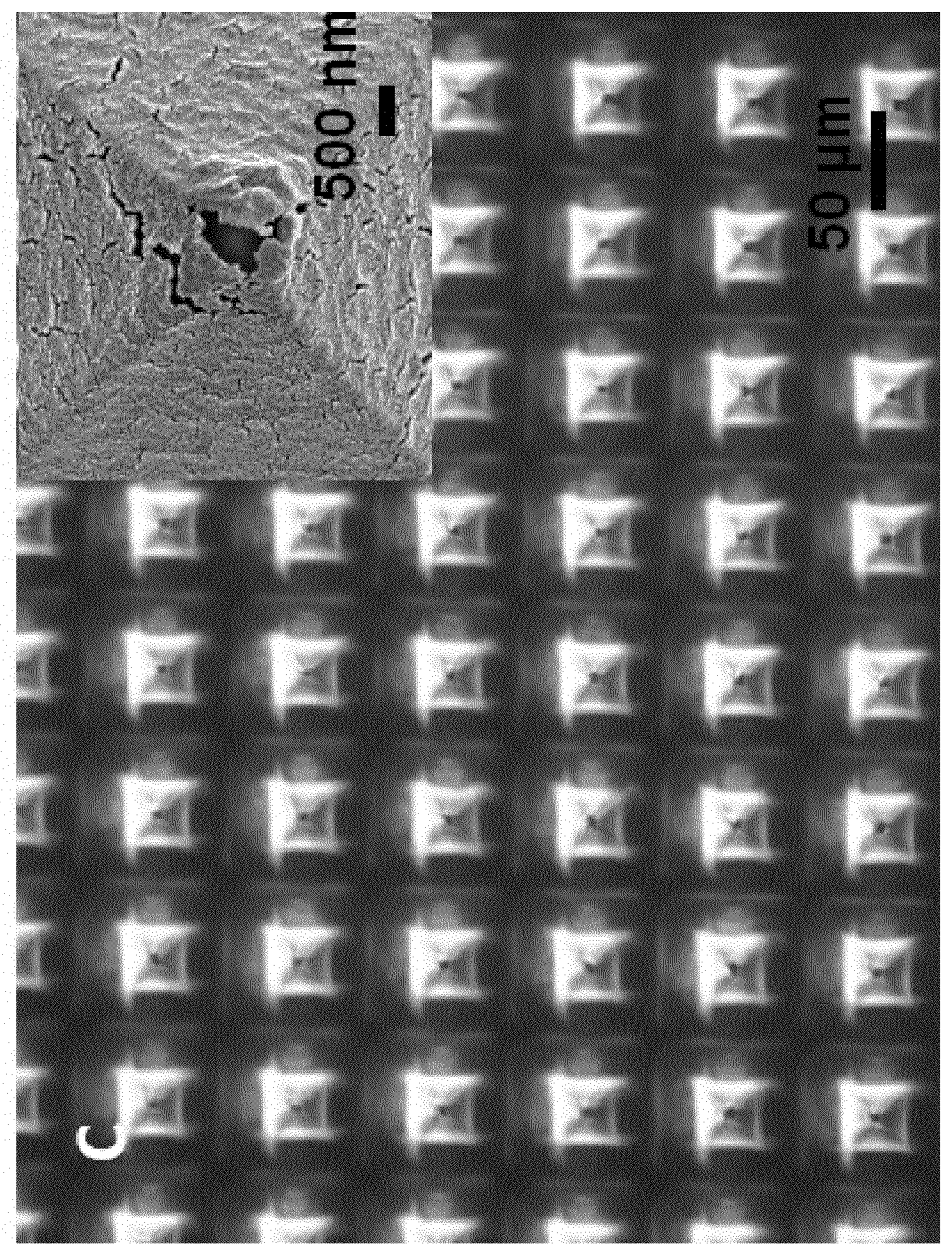
FIG. 2B is an SEM image of a beam pen tip array embodiment, with the inset showing an aperture formed in a tip end.
Figure 2C:
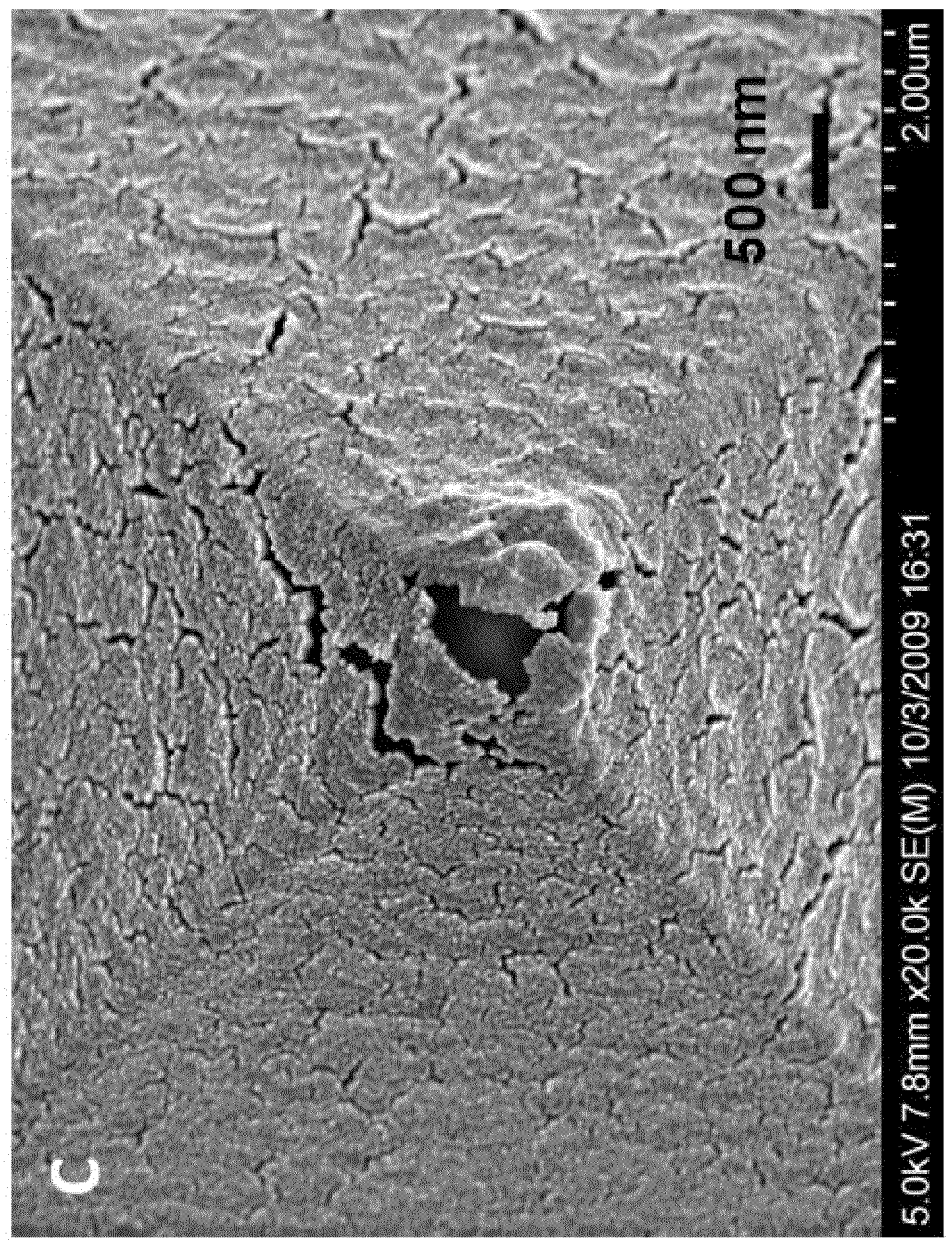
FIG. 2C is an SEM image of the tip end of the single beam pen tip embodiment shown in the inset of FIG. 2B.
Figure 2D:
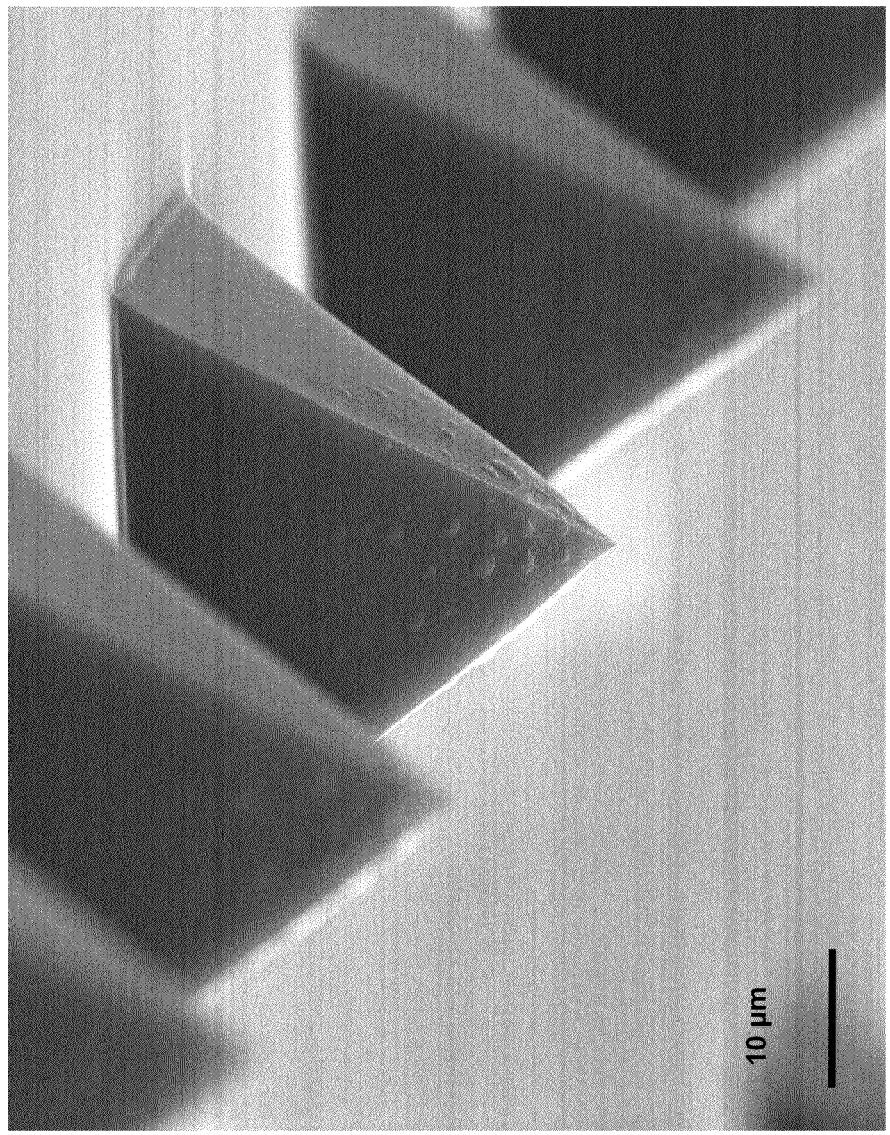
FIG. 2D is an SEM image of a beam pen tip array embodiment having an array of polymer pens coated with a layer of gold and apertures in the gold layer at the tip ends.

Referring to FIGS. 1B and 2A-2D, an embodiment of a BPL tip array 10 includes a tip substrate layer 12 (see FIG. 1B) and a plurality of tips 14 (see FIG. 1B) fixed to the tip substrate layer 12. The tip substrate layer 12 and the plurality of tips 14 are formed of a transparent polymer. The tip substrate layer 12 and the tips 14 can be formed of the same polymer or can be formed of different polymers. The tip array 10 further includes a blocking layer 16 coated on the sidewalls of the tips 14 and on the portions of the tip substrate layer 12 between adjacent tips 14. Referring to FIGS. 2B and 2C, an aperture 18 is defined in the blocking layer 16 at the tip end (e.g., the photosensitive layer 20-contacting end of each of the tips 14), such that the transparent polymer tip end is exposed through the aperture 18.

The tip substrate layer 12 can have any suitable thickness, for example in a range of about 50 μm to about 5 mm, about 50 μm to about 100 μm, or about 1 mm to about 5 mm. For example, the tip substrate layer 12 can have a minimum thickness of about 50, 100, 200, 300, 400, 500, 600, 700, 800, 900, 1000, 2000, 3000, 4000, or 5000 μm. For example, the tip substrate layer 12 can have a maximum thickness of about 50, 100, 200, 300, 400, 500, 600, 700, 800, 900, 1000, 2000, 3000, 4000, or 5000 μm. The thickness of the tip substrate layer can be decreased as the rigidity of the polymer used to form the tip substrate layer increases. For example, for a gel polymer (e.g., agarose), the tip substrate layer can have a thickness in a range of about 1 mm to about 5 mm. For other, more rigid, polymers (e.g., PDMS) the tip substrate layer can have a thickness in a range of about 50 μm to about 100 μm, for example. The combined thickness of the tip substrate layer 12 and the tips 14 can be in range of about 50 μm to about 5 mm. For example, for a gel polymer (e.g., agarose), the combined thickness can be up to about 5 mm. For example, for other polymers (e.g., PDMS) the combined thickness can be less than about 200 μm, preferably less than about 150 μm, or more preferably about 100 μm.

The tip substrate layer 12 can be attached to a transparent rigid support, for example, formed from glass, silicon, quartz, ceramic, polymer, or any combination thereof. The rigid support is preferably highly rigid and has a highly planar surface upon which to mount the tip array 10.

The tip arrays are non-cantilevered and comprise tips 14 which can be designed to have any shape or spacing (pitch) between them, as needed. The shape of each tip can be the same or different from other tips 14 of the array, and preferably the tips 14 have a common shape. Contemplated tip shapes include spheroid, hemispheroid, toroid, polyhedron, cone, cylinder, and pyramid (trigonal or square). The tips 14 have a base portion fixed to the tip substrate layer 12. The base portion preferably is larger than the tip end portion. The base portion can have an edge length in a range of about 1 μm to about 50 μm, or about 5 μm to about 50 μm. For example, the minimum edge length can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 μm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 μm.

Referring to FIG. 2A, a preferred tip array 10 contains thousands of tips 14, preferably having a pyramidal shape. The substrate-contacting (tip end) portions of the tips 14 each can have a diameter in a range of about 50 nm to about 1 μm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The substrate-contacting portions of the tips 14 are preferably sharp, so that each is suitable for forming submicron patterns, e.g., less than about 500 nm. The sharpness of the tip is measured by its radius of curvature. The tips 14 can have a radius of curvature, for example, of below about 1 μm, and can be less than about 0.9 μm, less than about 0.8 μm, less than about 0.7 μm, less than about 0.6 μm, less than about 0.5 μm, less than about 0.4 μm, less than about 0.3 μm, less than about 0.2 μm, less than about 0.1 μm, less than about 90 nm, less than about 80 nm, less than about 70 nm, less than about 60 nm, or less than about 50 nm.

The tip-to-tip spacing between adjacent tips 14 (tip pitch) can be in a range of about 1 μm to about over 10 mm, or about 20 μm to about 1 mm. For example, the minimum tip-to-tip spacing can be about 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 200 μm, 300 μm, 400 μm, 500 μm, 600 μm, 700 μm, 800 μm, 900 μm, 1 mm, 2 mm, 3 mm, 4 mm, 5 mm, 6 mm, 7 mm, 8 mm, 9 mm, or 10 mm. For example, the maximum tip-to-tip spacing can be about 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 200 μm, 300 μm, 400 μm, 500 μm, 600 μm, 700 μm, 800 μm, 900 μm, 1 mm, 2 mm, 3 mm, 4 mm, 5 mm, 6 mm, 7 mm, 8 mm, 9 mm, or 10 mm.

The tips 14 of the tip array 10 can be designed to have any desired thickness, but typically the thickness of the tip array 10 is about 50 nm to about 50 μm, about 50 nm to about 1 μm, about 10 μm to about 50 μm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 5 μm, 10 μm, 15 μm, 20 μm, 25 μm, 30 μm, 35 μm, 40 μm, 45 μm, or 50 μm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 μm, 5 μm, 10 μm, 15 μm, 20 μm, 25 μm, 30 μm, 35 μm, 40 μm, 45 μm, or 50 μm. The thickness of the tip array 10 can be decreased as the rigidity of the polymer used to form the tip substrate layer increases. For example, for a gel polymer (e.g., agarose), the tip array 10 can have a thickness in a range of about 10 μm to about 50 μm. For other polymers (e.g., PDMS), for example, the tip array 10 can have a thickness of about 50 nm to about 1 μm. As used herein, the thickness of the tip array 10 refers to the distance from the tip end to the base end of a tip. The tips 14 can be arranged randomly or in a regular periodic pattern (e.g., in columns and rows, in a circular pattern, or the like).

The blocking layer 16 on the polymer tip sidewalls serves as a radiation blocking layer 16, allowing the radiation illuminated on a surface of the substrate layer opposite the surface to which the tips 14 are fixed to be emitted only through the tip end exposed by the aperture 18 defined in the blocking layer 16. As shown in FIG. 1A, the exposure of a substrate pre-coated with a resist layer 20 with the radiation channeled through the tip ends 18 of the tip array 10 can allow for the formation of a single dot per tip for each exposure. The blocking layer 16 can be formed of any material suitable for blocking (e.g., reflecting) a type of radiation used in the lithography process. For example, the blocking layer 16 can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer 16 can have any suitable thickness, for example in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

Polymeric materials suitable for use in the tip array 10 can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. Nos. 5,776,748; 6,596,346; and 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir*, 1998, 14-15, 3791-3795. Hydrophobic polymers such as polydimethylsiloxane can be modified either chemically or physically by, for example, exposure to a solution of a strong oxidizer or to an oxygen plasma.

The polymer of the tip array 10 can be a polymer gel. The gel polymer can comprise any suitable gel, including hydrogels and organogels. For example, the polymer gel can be a silicon hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example the gel can be greater than 95% liquid, yet behave like a solid due to the presence of a cross-linked network within the liquid.

The material used to form the tip array 10 has a suitable compression modulus and surface hardness to prevent collapse of the tip during contact with the surface, but too high a modulus and too great a surface hardness can lead to a brittle material that cannot adapt and conform to a substrate surface during exposure. As disclosed in Schmid, et al., *Macromolecules*, 33:3042 (2000), vinyl and hydrosilane prepolymers can be tailored to provide polymers of different modulus and surface hardness. Thus, in another type of embodiment, the polymer can be a mixture of vinyl and hydrosilane prepolymers, wherein the weight ratio of vinyl prepolymer to hydrosilane crosslinker is about 5:1 to about 20:1, about 7:1 to about 15:1, or about 8:1 to about 12:1.

The material used to form the tip array 10 preferably will have a surface hardness of about 0.2% to about 3.5% of glass, as measured by resistance of a surface to penetration by a hard sphere with a diameter of 1 mm, compared to the resistance of a glass surface (as described in Schmid, et al., *Macromolecules*, 33:3042 (2000) at p 3044). The surface hardness optionally can be about 0.3% to about 3.3%, about 0.4% to about 3.2%, about 0.5% to about 3.0%, or about 0.7% to about 2.7% of glass. The polymers of the tip array 10 can have a compression modulus of about 10 MPa to about 300 MPa. The tip array 10 preferably comprises a compressible polymer which is Hookean under pressures of about 10 MPa to about 300 MPa. The linear relationship between pressure exerted on the tip array 10 and the feature size allows for control of the near field and feature size using the disclosed methods and tip arrays (see FIG. 2B).

BPL Tip Array Formation

The tip portion of the tip arrays can be made with a master prepared by conventional photolithography and subsequent wet chemical etching. The mold can be engineered to contain as many tips 14 arrayed in any fashion desired. The tips 14 of the tip array 10 can be any number desired, and contemplated numbers of tips 14 include about 1000 tips 14 to about 15 million tips, or greater. The number of tips 14 of the tip array 10 can be greater than about 1 million, greater than about 2 million, greater than about 3 million, greater than about 4 million, greater than 5 million tips 14, greater than 6 million, greater than 7 million, greater than 8 million, greater than 9 million, greater than 10 million, greater than 11 million, greater than 12 million, greater than 13 million, greater than 14 million, or greater than 15 million tips.

Optionally, the tips 14 can be cleaned, for example, using oxygen plasma, prior to coating with the blocking layer 16. The blocking layer 16 can be disposed on the tips 14 by any suitable process, including coating, for example, spin-coating, the tips 14 with the blocking layer 16

Figure 2E:
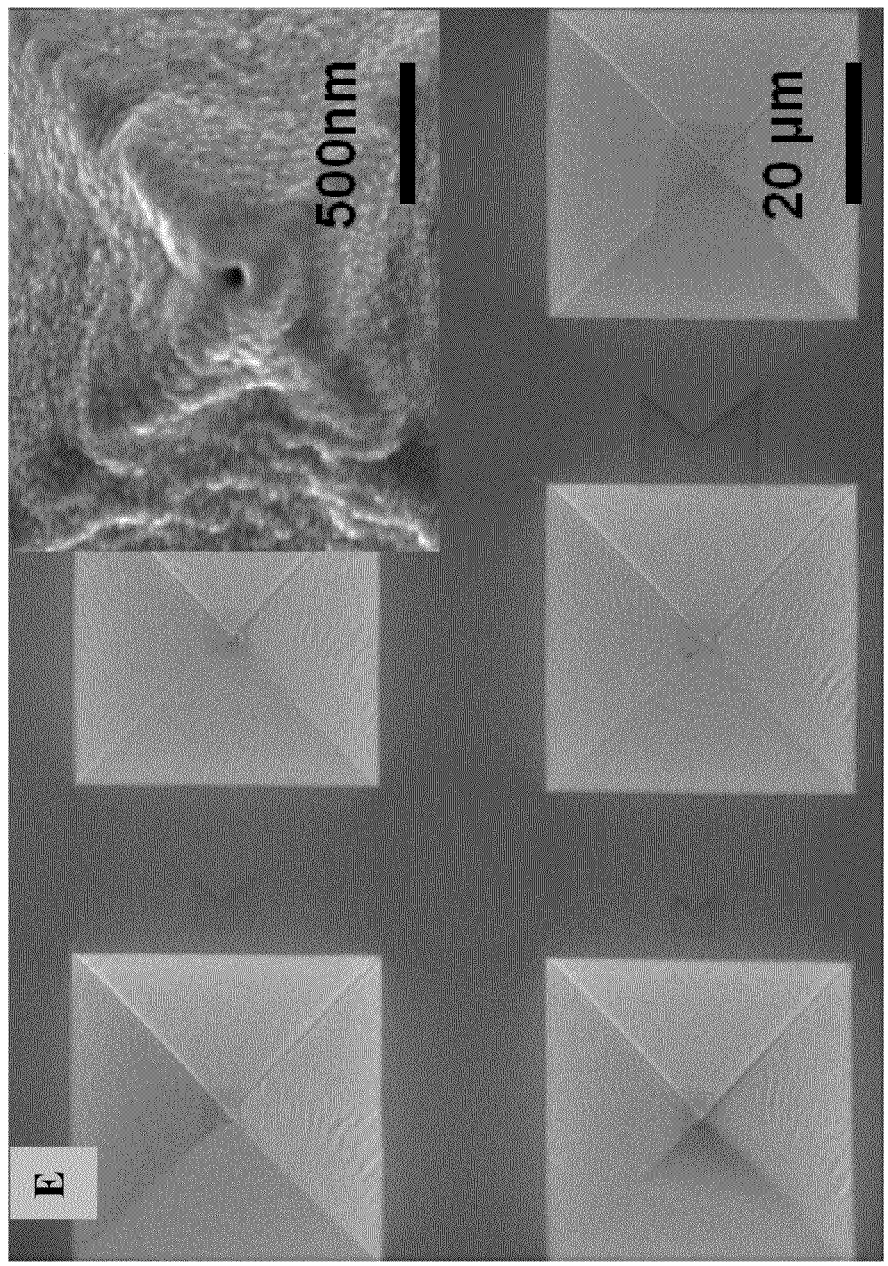
FIG. 2E is an SEM image of a beam pen tip array embodiment having apertures formed by focused ion beam ablation (FIB), with the inset demonstrating that the diameter of the apertures is 50±5 nm.

An aperture 18 in the blocking layer 16 can be formed by any suitable method, including, for example, focused ion beam (FIB) methods (FIG. 2E) or using a lift-off method. The lift-off method can be a dry lift off method. Referring to FIG. 3B, one suitable approach includes applying an adhesive 22, such as poly(methyl methacrylate) (PMMA) on top of the blocking layer 16 of the tip array 10, and removing a portion of the adhesive 22 material disposed at the substrate contacting end of the tips 14 by contacting the tip array 10 to a clean and flat surface, for example a glass surface. The tips 14 can then be immersed in an etching solution to remove the exposed portion of the blocking layer 16 to form the aperture 18 and expose the material of the tip, e.g. the transparent polymer. The remaining adhesive 22 material protects the covered surfaces of the blocking layer 16 from being etched during the etching step. The adhesive can be, for example, PMMA, poly(ethylene glycol) (PEG), polyacrylonitrile, and combinations thereof.

Figure 3A:
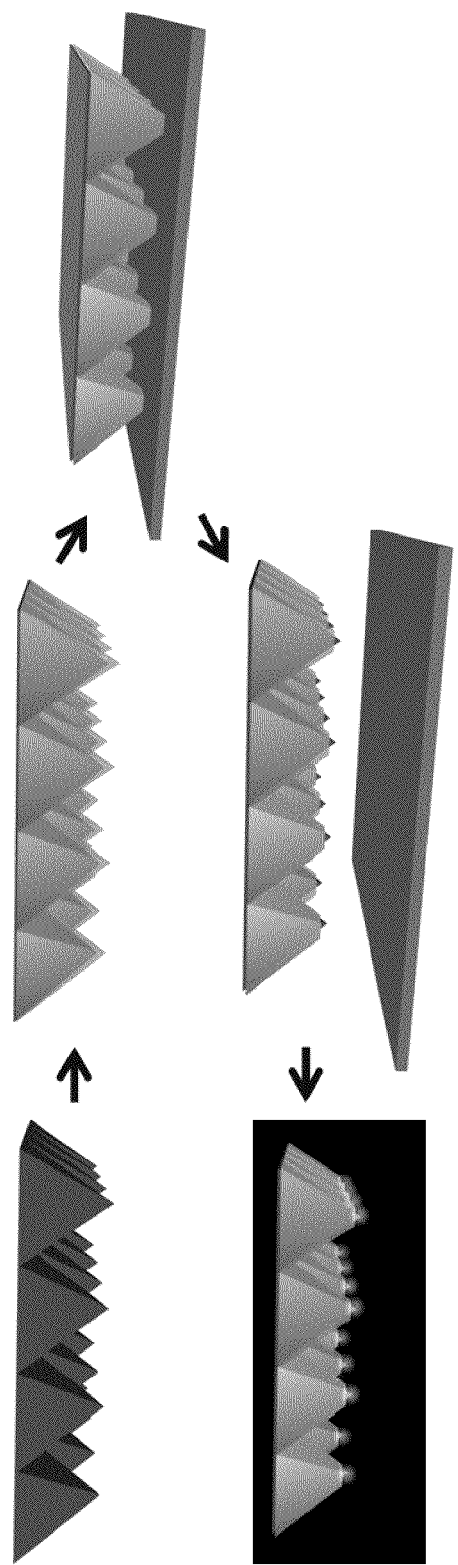
FIG. 3A is a schematic illustration of a method of making a beam pen tip array in accordance with an embodiment of the disclosure.
Figure 3B:
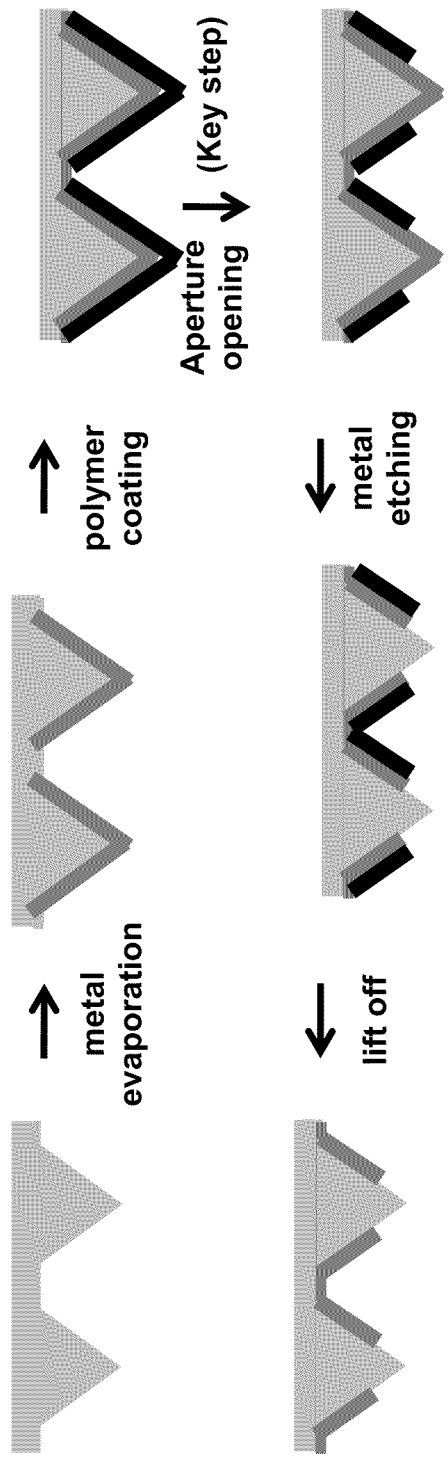
FIG. 3B is a schematic illustration of a method of making a beam pen tip array in accordance with another embodiment of the disclosure.

Referring to FIG. 3A, alternatively, a simple contact approach can be used in which a tip array 10 having the blocking layer 16 is brought in contact with a glass slide or other surface coated with an adhesive 22 material, such as PMMA. Other suitable adhesive 22 materials include, for example, PMMA, PEG, polyacrylonitrile, and combinations thereof. Upon removal of the pen tip from surface coated with the adhesive 22 material, the adhesive 22 material removes the contacted portion of the blocking layer 16, thereby defining an aperture 18 and exposing the tip material, e.g. the transparent polymer.

In either of the above described aperture 18 forming methods, the size of the aperture 18 formed can be controlled by applying different external forces on the backside of the BPL tip array 10. As a result of the flexibility of elastomeric tips 14, the application of force on the backside of the BPL tip array 10 can be used to control the contact area between the tips 14 and adhesive 22 material surface. Referring to FIG. 3A, the BPL tip array 10 can include pyramidal tips 14, with each pyramid-shaped tip being covered by a gold blocking layer 16 having a small aperture 18 defined in the blocking layer 16 at the very end of the tip. The size of the aperture 18 does not significantly change from tip to tip. For example, the size of the aperture 18 can vary less than about 10% from tip to tip. The size of the aperture 18 can be tailored over the 200 nm to 1 to 10 µm ranges, for example, by controlling contact force. For example, the aperture 18 can have a diameter in a range of about 5 nm to about 5 µm, about 30 nm to about 500 nm, or about 200 nm to about 5 µm. For example, the minimum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. The contact force optionally can be in a range of about 0.002 N to about 0.2N for a 1 cm$^2$ pen array.

For example, a PDMS array of pyramid-shape tips 14 can be fabricated by known methods. (17, 20). For example, each pyramid tip can have a square base with a several tens of µm edge length and can come to a tip that has tip diameter of about 100 nm. The entire array, including tips 14, can then be cleaned, for example, by oxygen plasma and covered with a blocking layer 16 (e.g. gold), by a thermal evaporation method, for example. The coating can include, for example, a layer of gold that is about 80 nm thick with an about 5 nm thick Ti adhesion layer. The tip array 10 is then brought in contact with a glass slide coated with PMMA, an adhesive 22 material, which subsequently removes the Au/Ti layer from the PDMS tips 14 and exposes the underlying transparent PDMS.

Surfaces to be Patterned

The surfaces to pattern by BPL can include any suitable substrate, and preferably one which can be advantageously affected by exposure to radiation. For example, the substrate can be photosensitive or can include a photosensitive layer 20. For example, the photosensitive substrate or photosensitive layer 20 can be a resist layer. The resist layer can be any known resist material, for example SHIPLEY1805 (MicroChem. Inc.). Other suitable resist materials include, but are not limited to, Shipley1813 (MicroChem. Inc.), Shipley1830 (MicroChem. Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass ($SiO_2$), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer 20 can have any suitable thickness, for example in a range of about 100 nm to about 5000 nm. For example, the minimum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the tip array 10 can be modulated by modifying the resist material used and/or the thickness of the photosensitive substrate or photosensitive layer 20. For example, under the same radiation conditions, a thicker photosensitive layer can result in indicia having larger diameters. At constant photosensitive layer thickness, an increase radiation intensity can results in indicia having larger diameters.

Patterning

BPL can be performed using any suitable platform, for example, a Park AFM platform (XEP, Park Systems Co., Suwon, Korea) equipped with a halogen light source. BPLAs another example, a Zeiss microscope can be used with a light source having a wavelength in a range of about 360 nm to about 450 nm. Movement of the tip array 10 when using the Zeiss microscope can be controlled, for example, by the microscope stage.

Referring again to FIGS. 1A and 1B, in an embodiment of the method, a transparent polymer tip array 10 is brought in contact with a photosensitive layer 20, for example, for example SHIPLEY1805 (MicroChem. Inc.) photoresist material, followed by exposure (e.g. illumination) of the top surface (the substrate layer) of the tip array 10 with a radiation source. As a result of the blocking layer 16 blocking the radiation (e.g., by reflection), the radiation is transmitted through the transparent polymer and out the portion of the transparent polymer exposed by the aperture 18 (i.e., the tip end). Historically, photolithography has used ultraviolet light from gas-discharge lamps using mercury, sometimes in combination with noble gases such as xenon. These lamps produce light across a broad spectrum with several strong peaks in the ultraviolet range. This spectrum is filtered to select a single spectral line, for example the "g-line" (436 nm) or "i-line" (365 nm). More recently, lithography has moved to "deep ultraviolet," for example wavelengths below 300 nm, which can be produced by excimer lasers. Krypton fluoride produces a 248-nm spectral line, and argon fluoride a 193-nm line. In principle, the type of radiation used with the present apparatus and methods is not limited. One practical consideration is compatibility with the pen array materials. Radiation in the wavelength range of about 300 nm to about 600 nm is preferred, optionally 380 nm to 420 nm, for example about 365 nm, about 400 nm, or about 436 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm.

The photosensitive layer 20 can be exposed by the radiation transmitted through the polymer tip for any suitable time, for example in a range of about 1 second to about 1 minute. For example, the minimum exposure time can be about 1, 2, 3, 4, 5, 6, 7, 8, 9, 10, 20, 30, 40, 50, or 60 seconds. For example, the maximum exposure time can be about 1, 2, 3, 4, 5, 6, 7, 8, 9, 10, 20, 30, 40, 50, or 60 seconds.

The tip array 10 and/or the substrate can be moved during patterning to form the desired indicia. For example, in one embodiment, the tip array 10 is moved while the substrate is held stationary. In another embodiment, the tip array 10 is held stationary while the substrate is moved. In yet another embodiment, both the tip array 10 and the substrate are moved.

The method can further include developing the photosensitive layer 20, for example by any suitable process known in the art. For example, when a resist layer is used, the exposed resist layer can be developed for by exposed for about 30 seconds in MF319 (Rohm & Haas Electronic Materials LLC). The resist layer can be a positive resist or a negative resist. If a positive resist layer is used, developing of the resist layer 20 removes the exposed portion of the resist layer. If a negative resist layer is used, developing of the resist layer removes the unexposed portion of the resist layer. Optionally, the method can further include depositing a patterning layer on the substrate surface after exposure followed by lift off of the resist layer to thereby form the patterning layer into the indicia printed on the resist layer by BPL. The patterning layer can be a metal, for example, and can be deposited, for example, by thermal evaporation. The resist lift off can be performed using, for example, acetone.

Figure 4A:
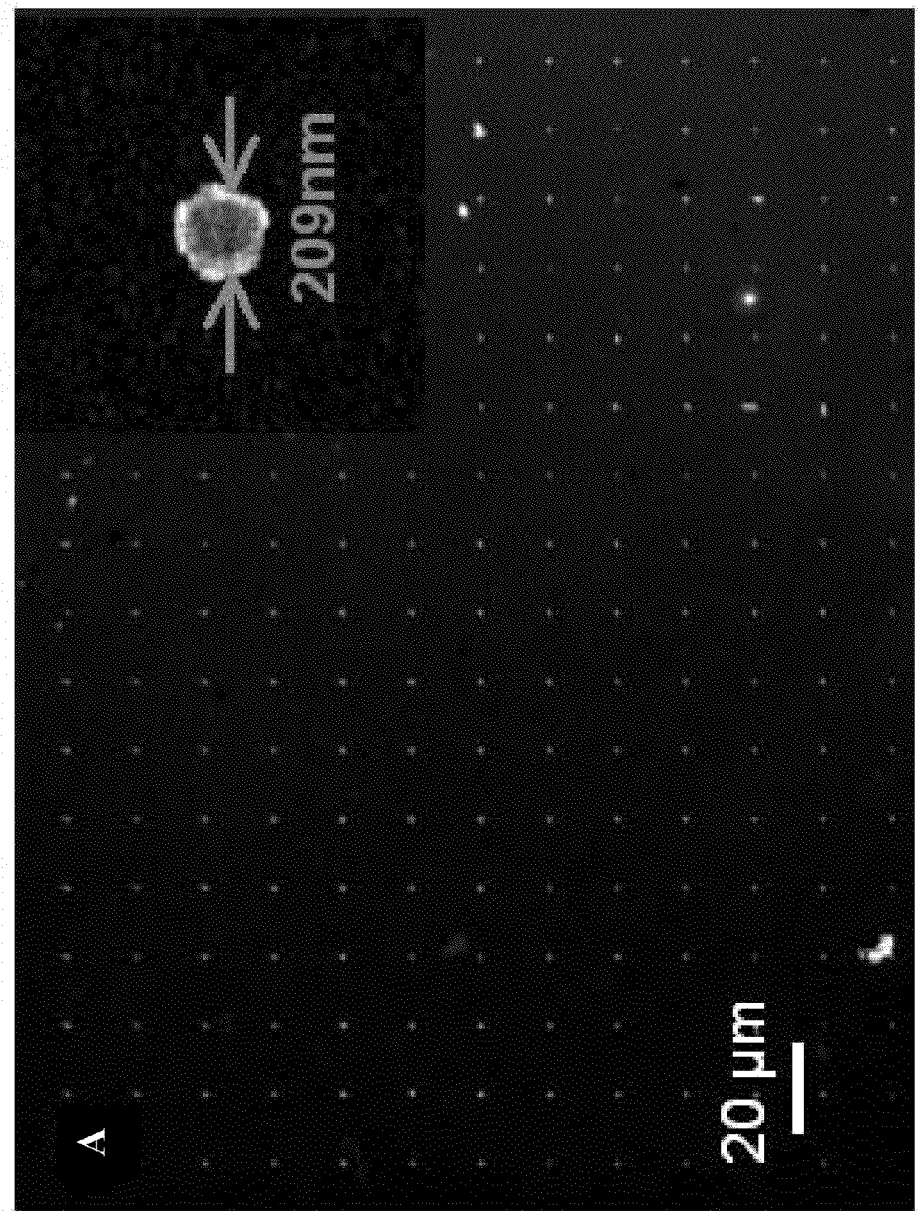
FIG. 4A is a dot array wherein each dot was created by different beam pen tips in a tip array embodiment under a single exposure. The diameter of the individual dots is approximately 209 nm (inset)
Figure 4B:
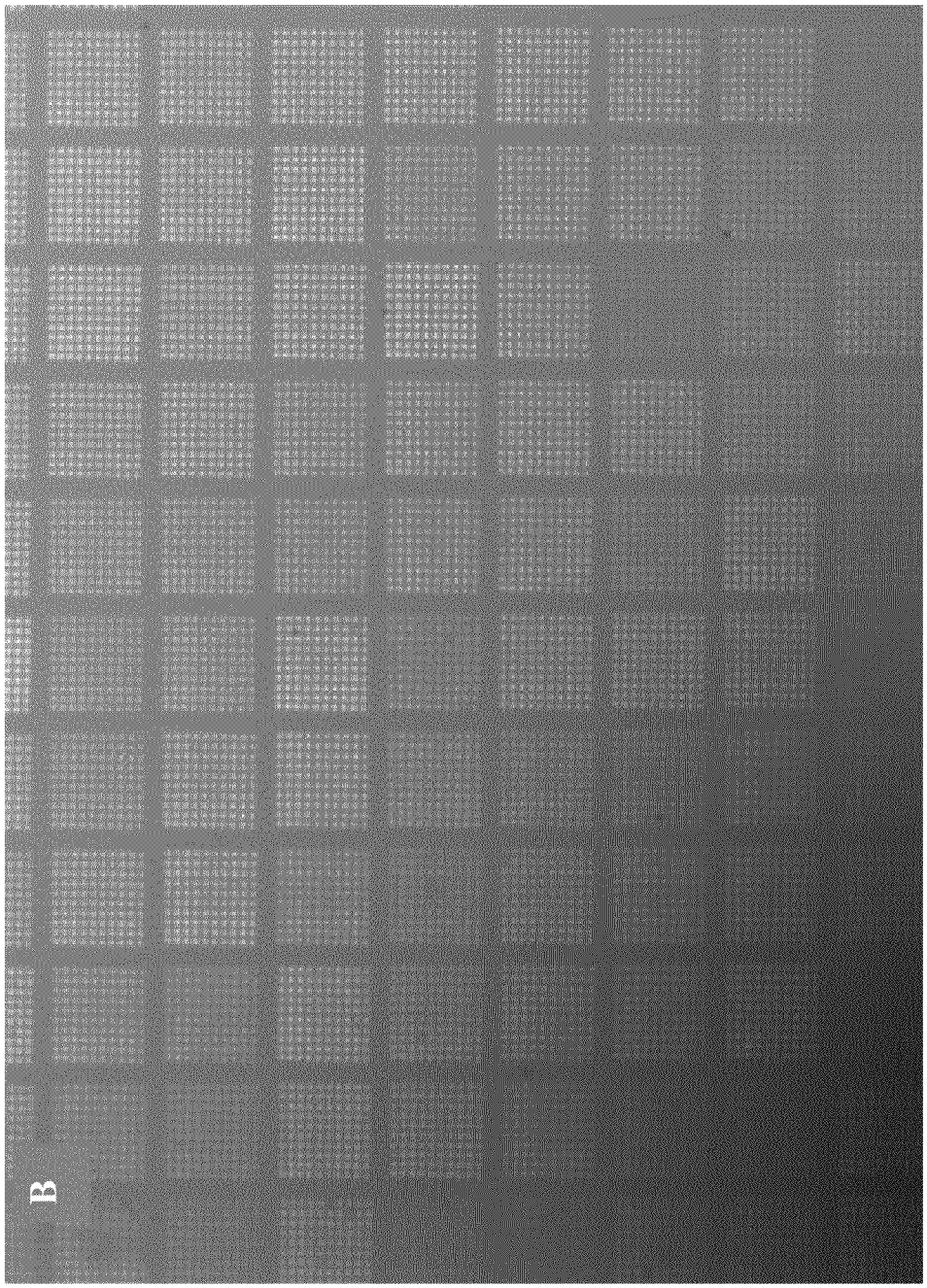
FIG. 4B is an optical image of an array of dot arrays made by an embodiment of beam pen lithography as described herein.
Figure 4C:
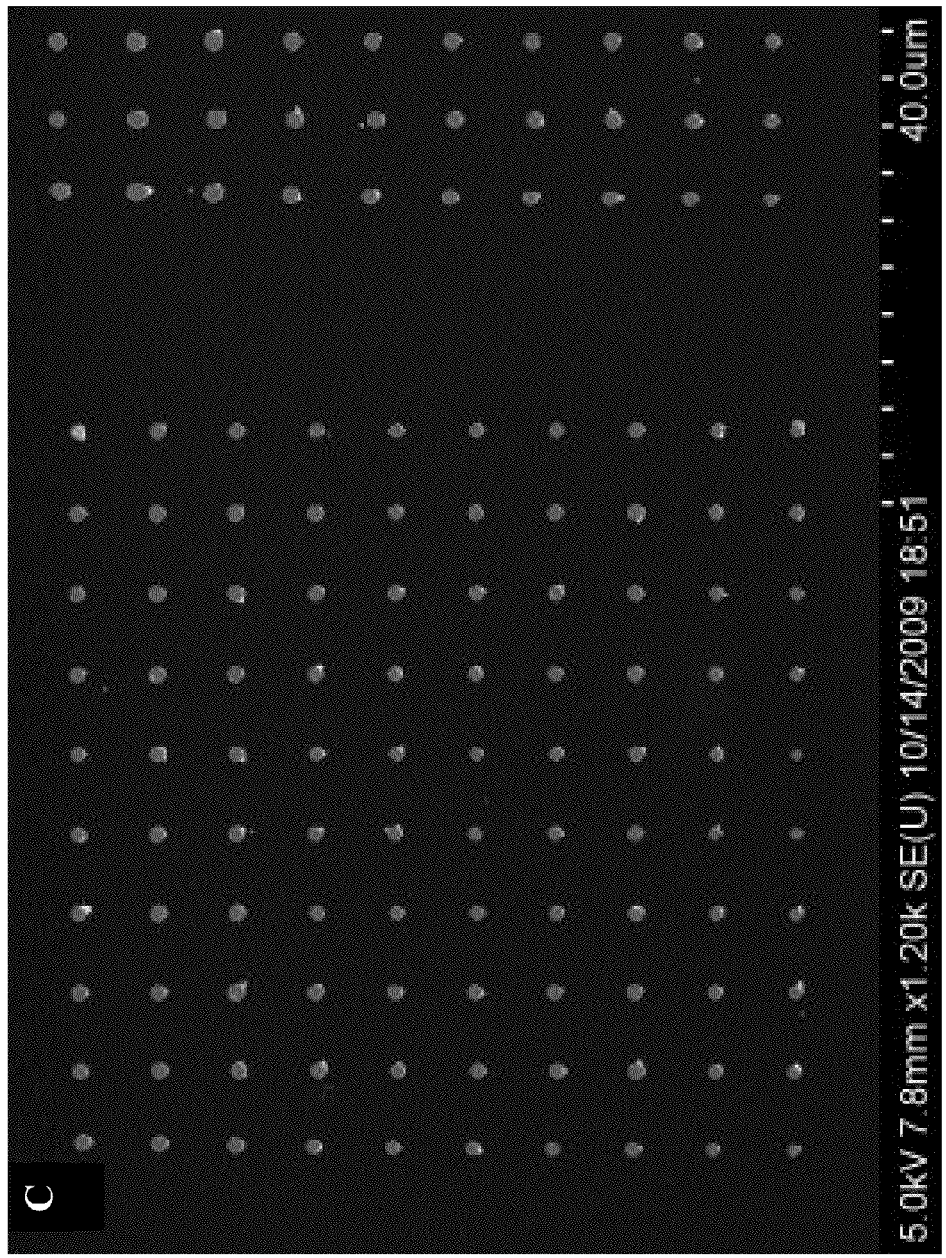
FIG. 4C is an SEM image of a dot array of FIG. 4B, illustrating that each array contains 10×10 dots; each 10×10 dot array was made by a single tip.
Figure 4D:
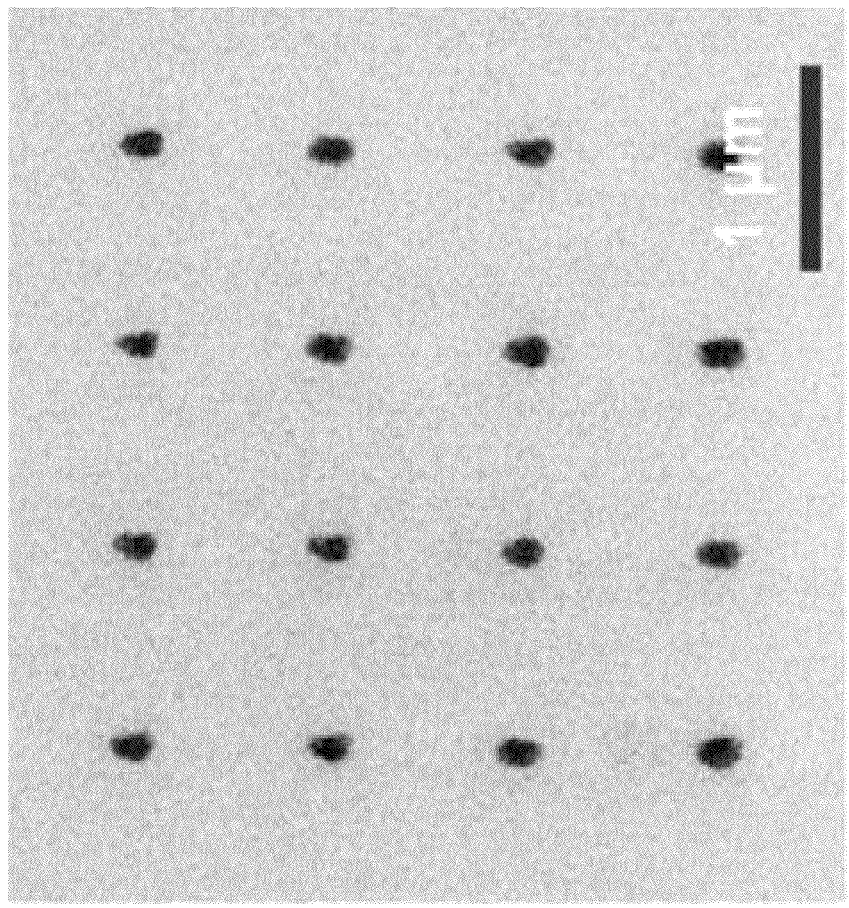
FIG. 4D is an SEM image of a chromium dot array created by an embodiment of beam pen lithography described herein, after metal evaporation and resist lift-off, with the apertures in the beam pen tip array being formed by FIB.

Referring to FIGS. 4B and 4C, when using large-scale 2D arrays of BPL tips (15,000 pens per cm$^2$), BPL can be used to do very high throughput lithography, yielding thousands of parallel-produced patterns at a time. The patterns can be the same, for example by using a uniform tip array 10. In the alternative, at least some of the patterns can differ from each other, for example by using a tip array 10 which is non-uniformly masked and lateral displacement of the tip array 10 while patterning which exceeds the tip pitch dimension. FIG. 4D illustrates a uniform dot array formed by a beam pen tip array 10 having apertures formed by FIB using an about 400 nm halogen light source and 40 nm thick resist layer 20. The aperture 18 diameter was 50±5 nm. After chromium evaporation and resist lift off, chromium dot features with diameters of 111±11 nm were generated. This feature size is below the diffraction limit of the light source.

Figure 6A:
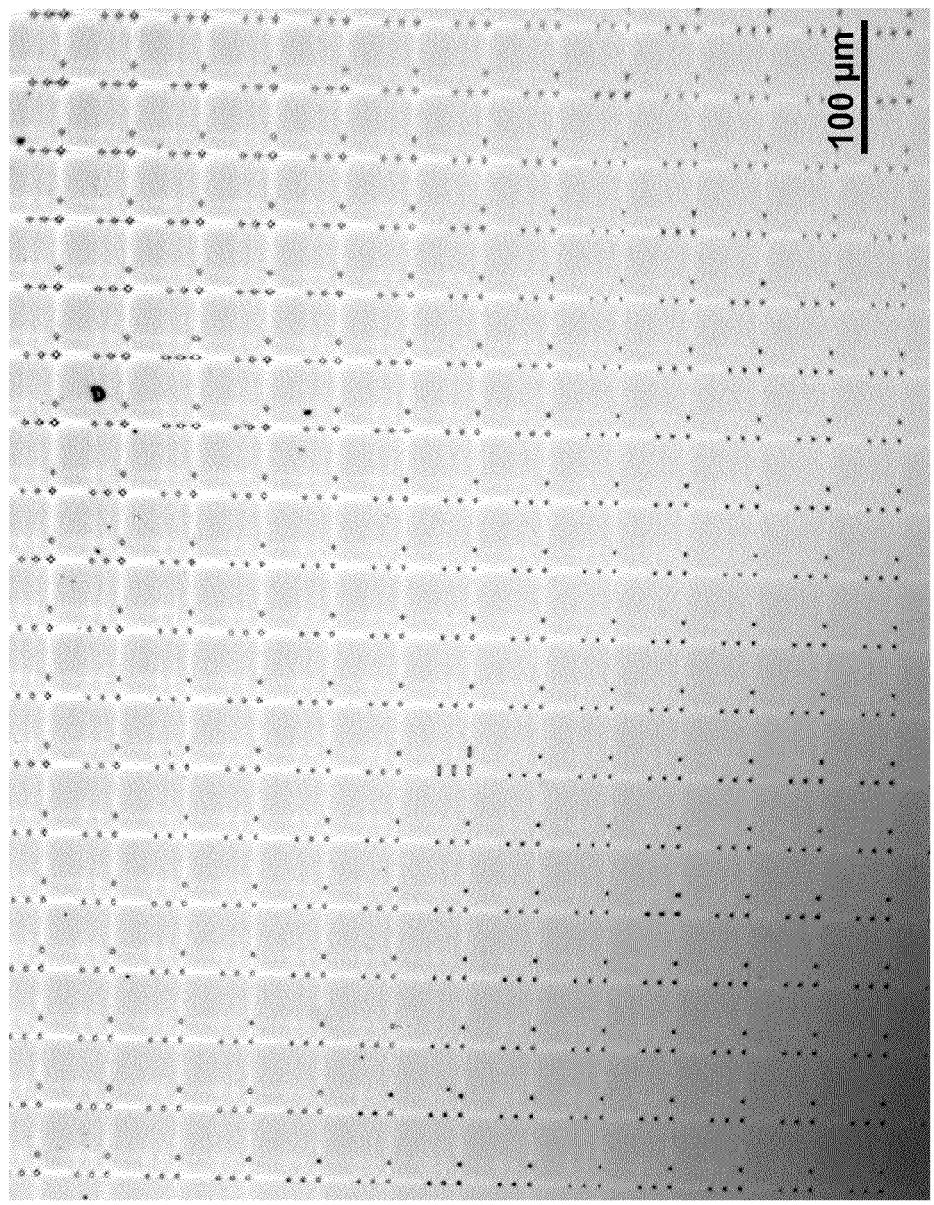
FIG. 6A is an optical image of dot arrays made by an embodiment of beam pen lithography described herein showing the letter "L"
Figure 6B:
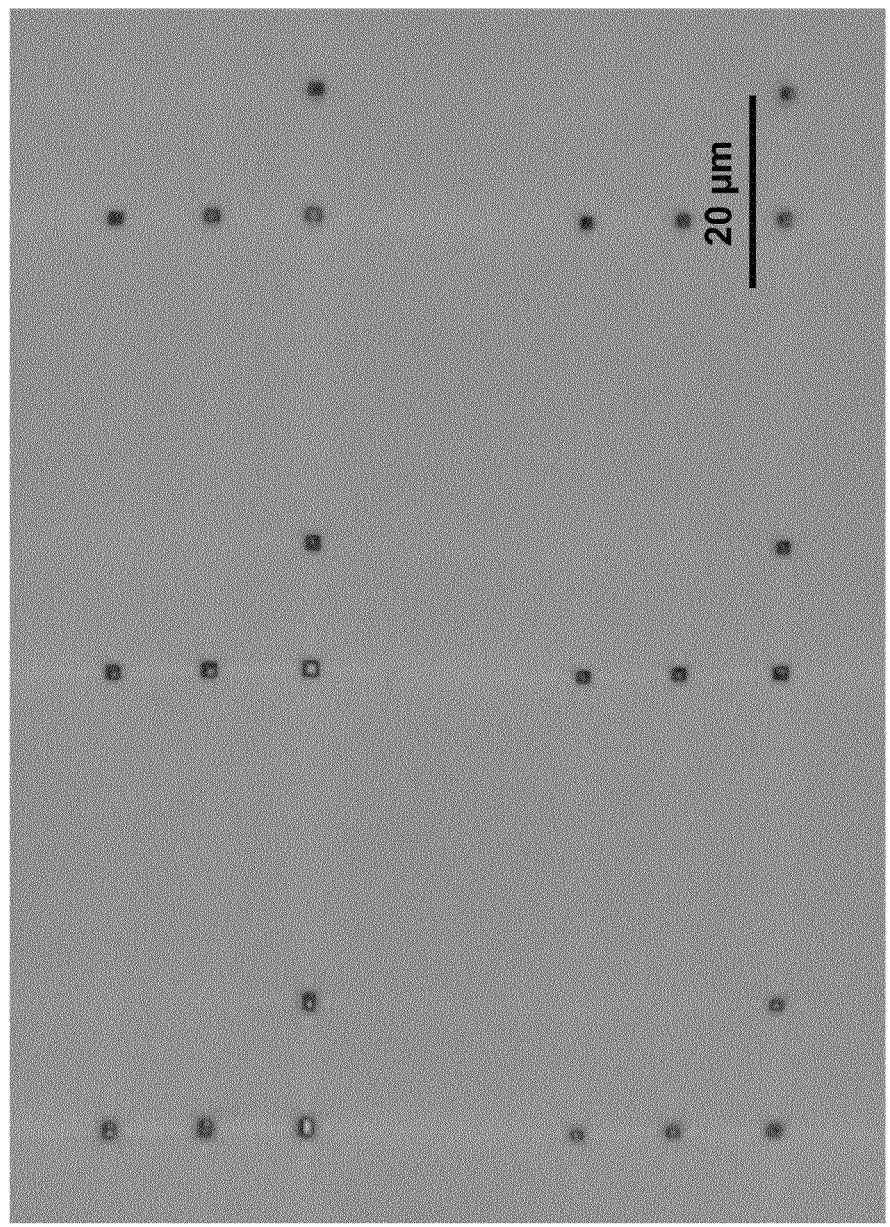
FIG. 6B is a zoom-in optical image of a the "L" dot array of FIG. 6A.
Figure 6C:
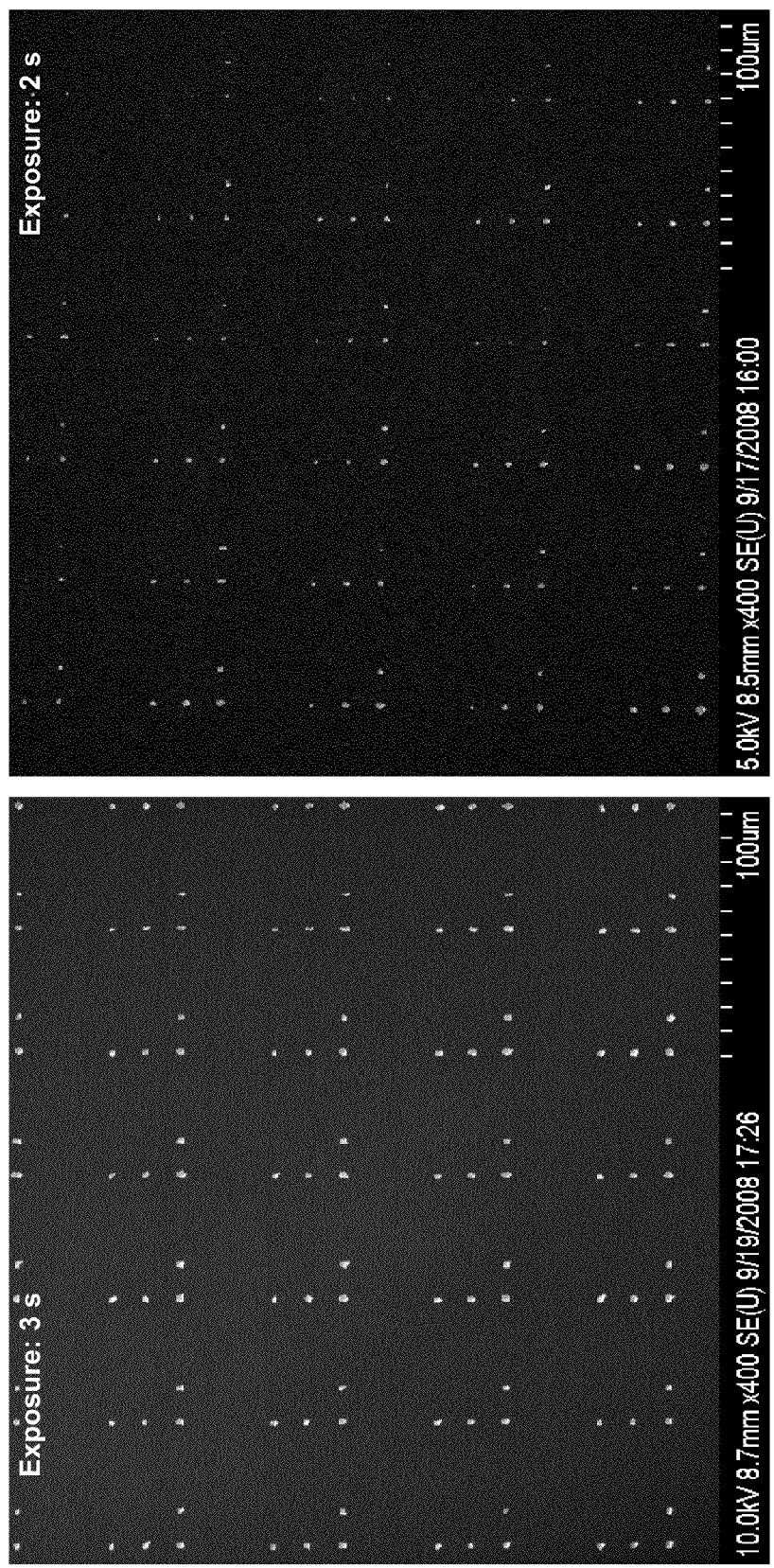
FIG. 6C are SEM images of the pattern of FIG. 6A after depositing a layer of gold to the surface followed by lift-off of the resist.
Figure 6D:
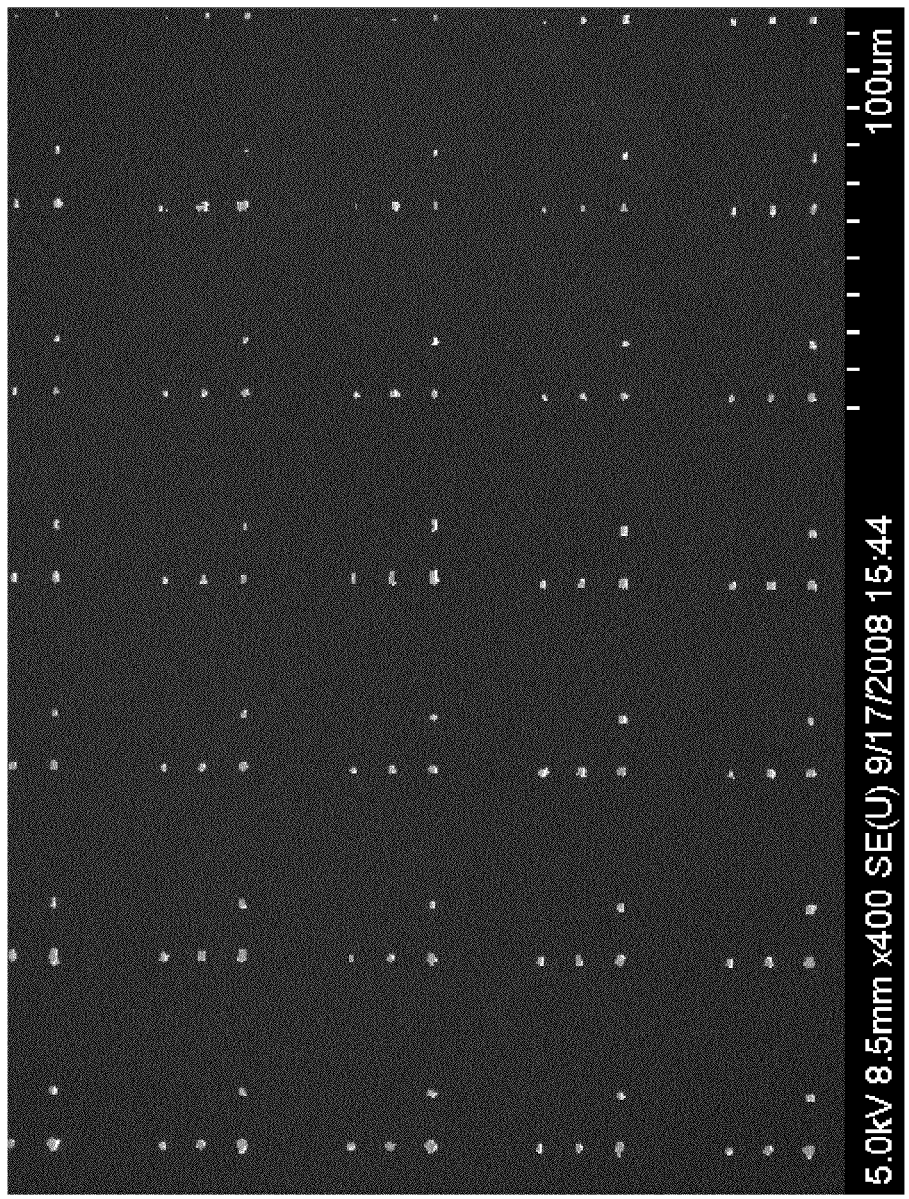
FIG. 6D is an SEM image of the gold dot pattern formed from the dot arrays of FIG. 6A after the resist lift-off process.
Figure 6E:
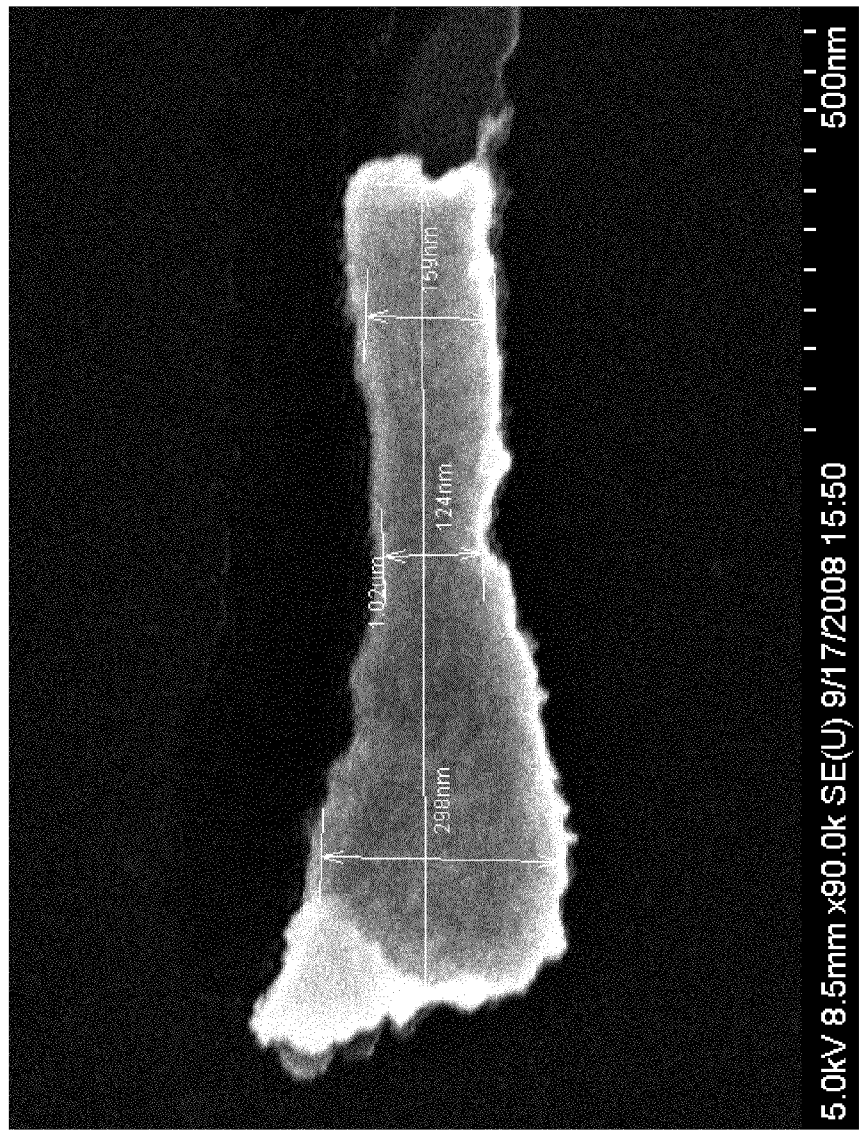
FIG. 6E is an SEM image of a gold dot from the gold dot pattern of FIG. 6D illustrating the dimensions of the pattern.
Figure 7A:
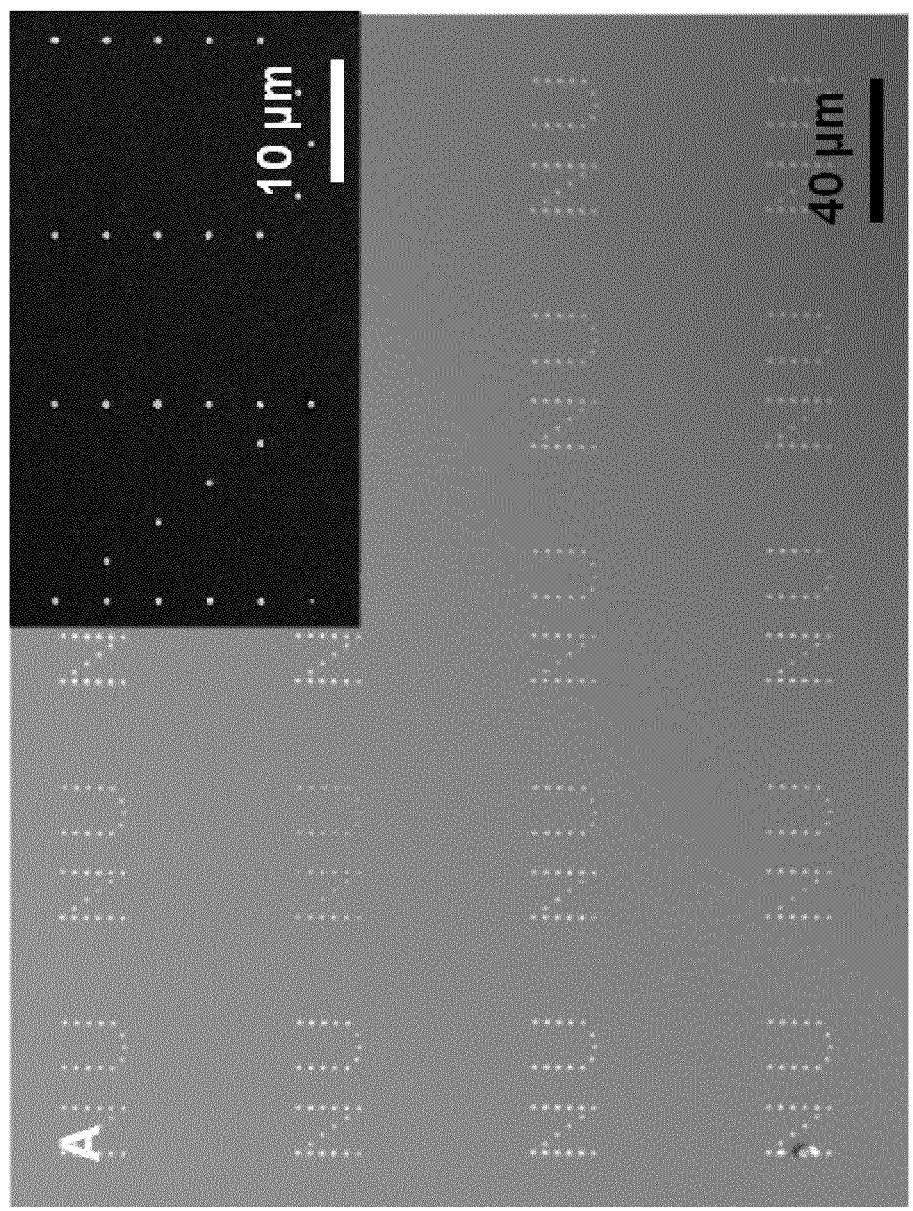
FIG. 7A is an image of dot arrays made by beam pen tips showing letters of "NU"; the inset shows a magnified SEM image of one pattern; the feature diameter is 430±80 nm.
Figure 7B:
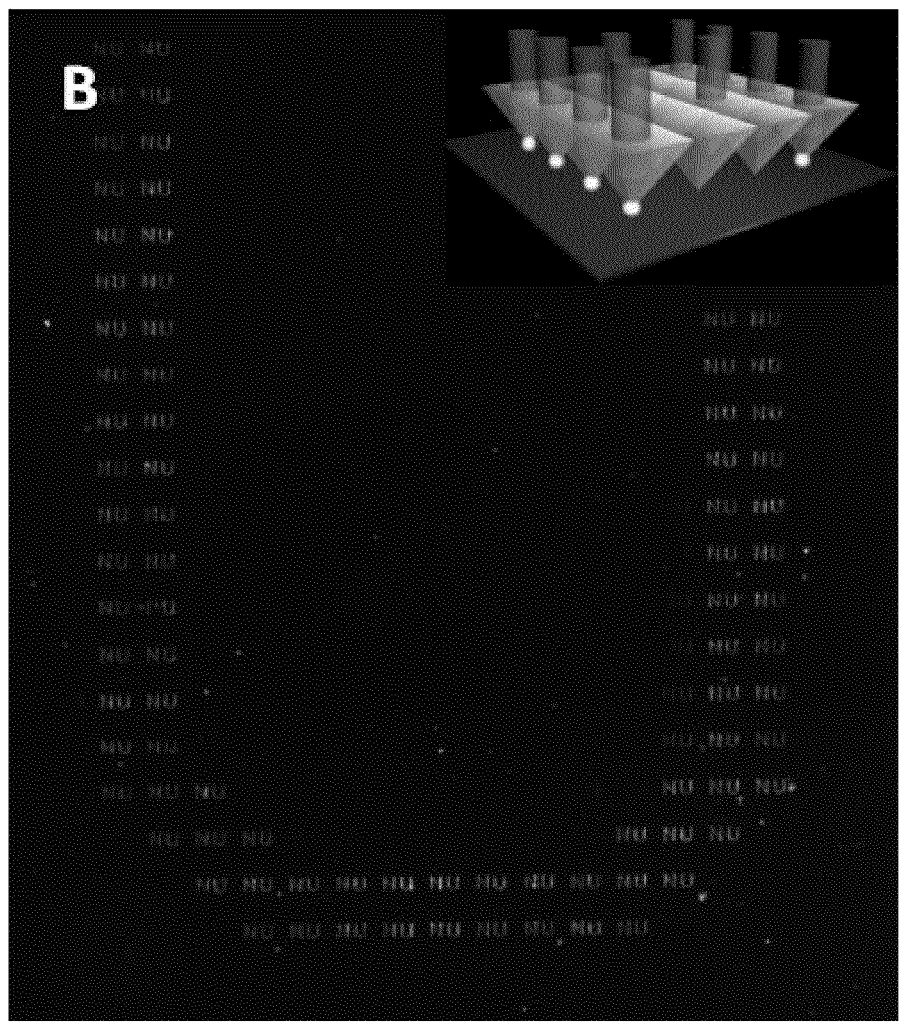
FIG. 7B is SEM image showing the macroscale selective illumination of the beam pen tip array with a mask in the shape of a "U" pattern as well as the nanoscale arbitrary pattern generation from each tip (small "NU") patterns, with the inset showing a simplified schematic illustration of a selective illumination scheme.
Figure 7C:
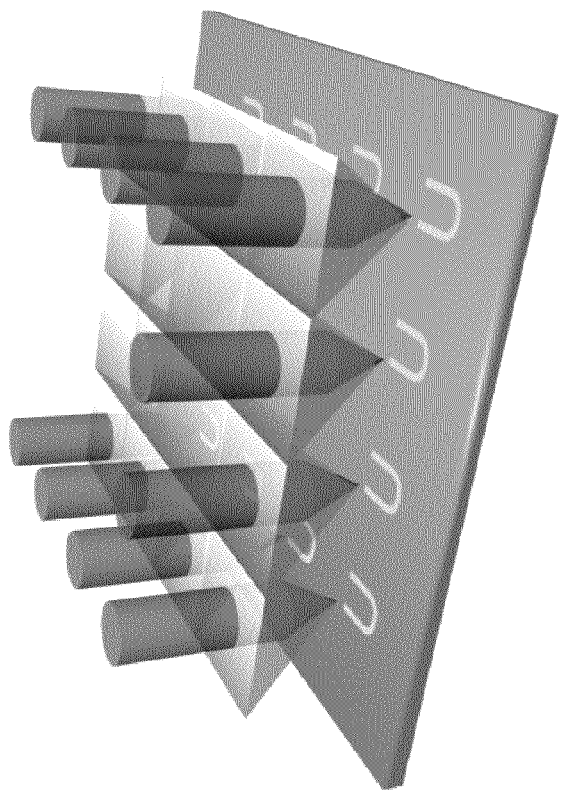
FIG. 7C is a simplified schematic representation of selective illumination of a tip array to form "N" and "U" patterns.
Figure 7C:
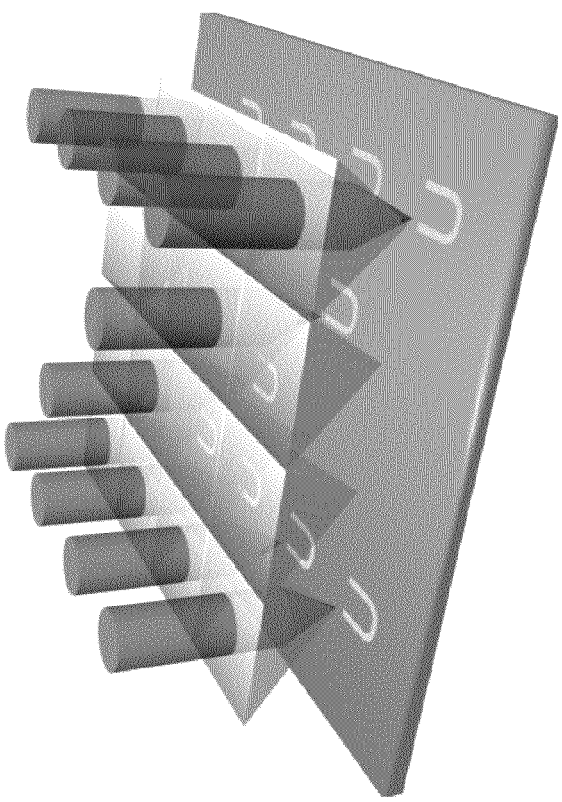
Figure 8A:
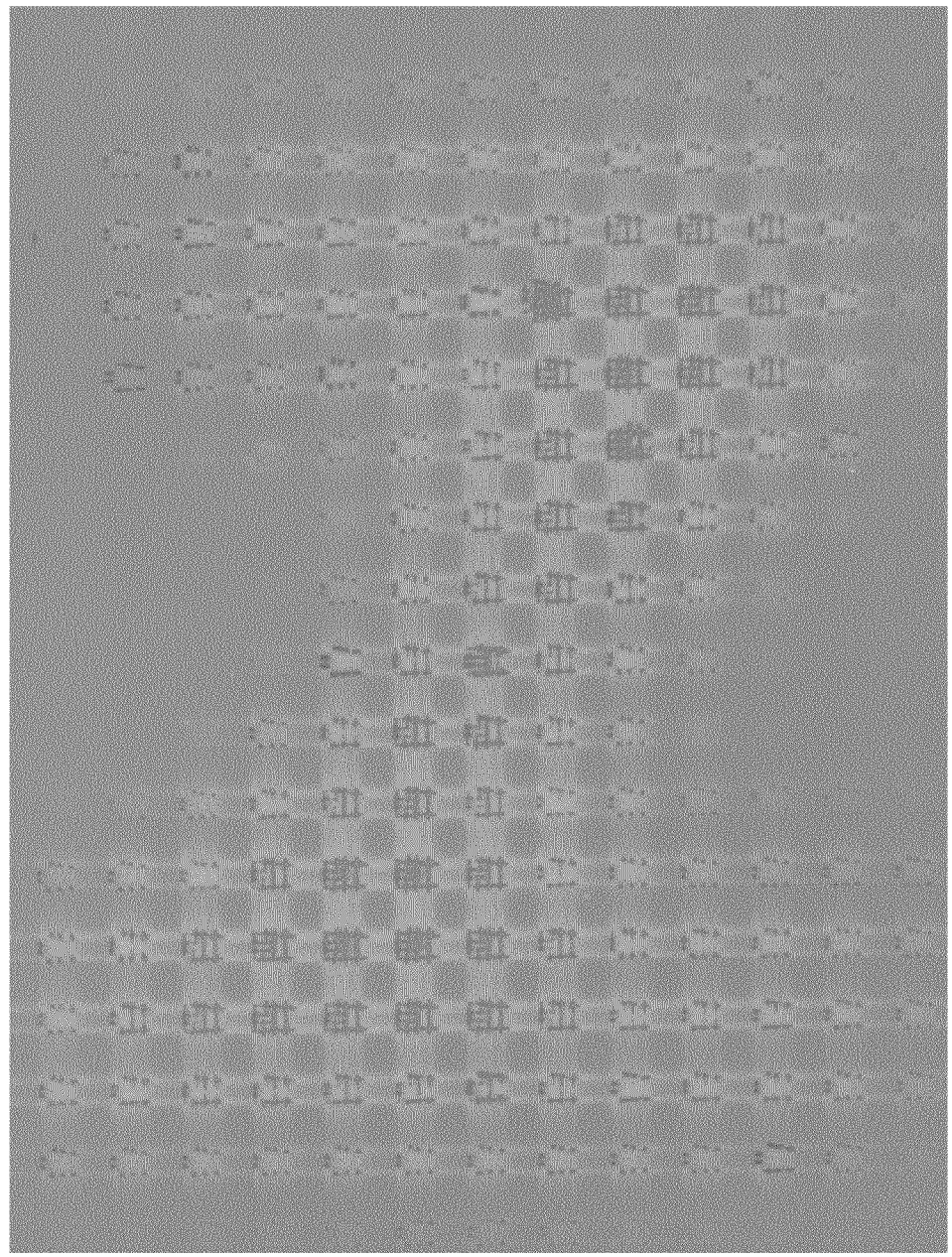
FIGS. 8A and 8B are optical images of an as-developed photoresist-coated substrate having macroscale patterns "N" and "U", respectively, formed by an embodiment of beam pen lithography according to the disclosure.
Figure 8B:
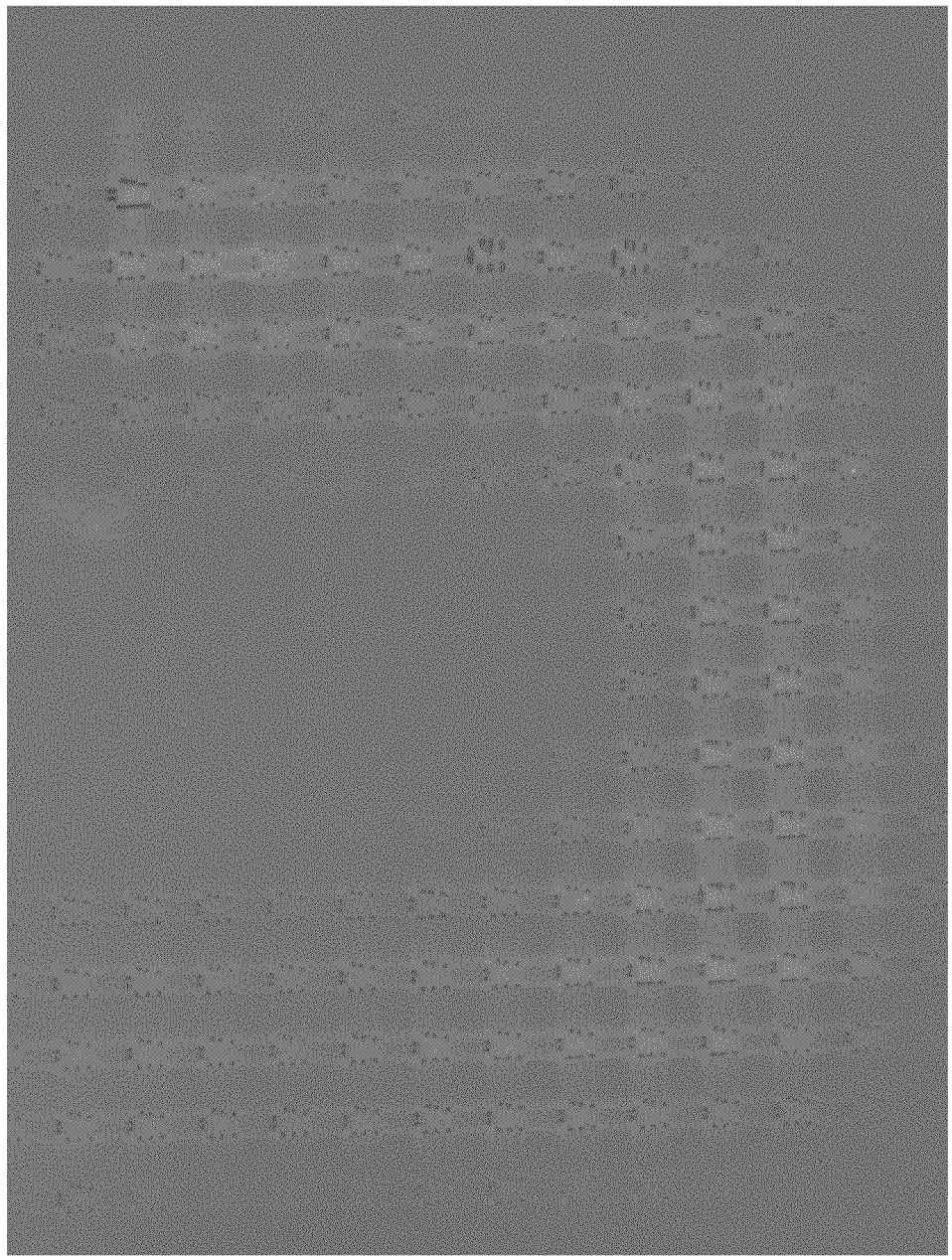
Figure 8C:
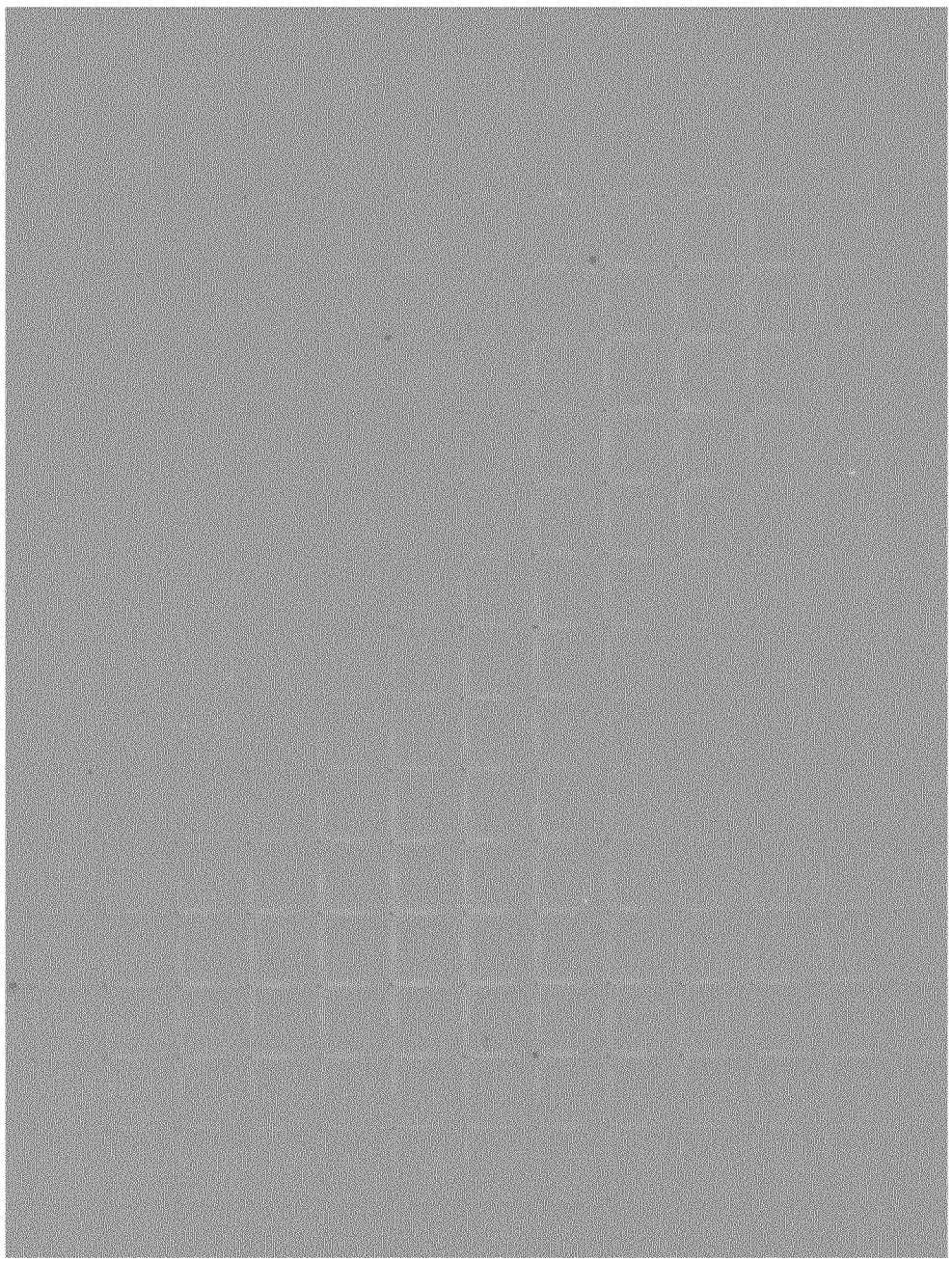
FIGS. 8C and 8D are zoom-in optical images of an as-developed photoresist-coated substrate, respectively, showing that each tip can be used to directly write single (8C) or multiple dots (8D) using beam pen lithography according to the disclosure.
Figure 8D:
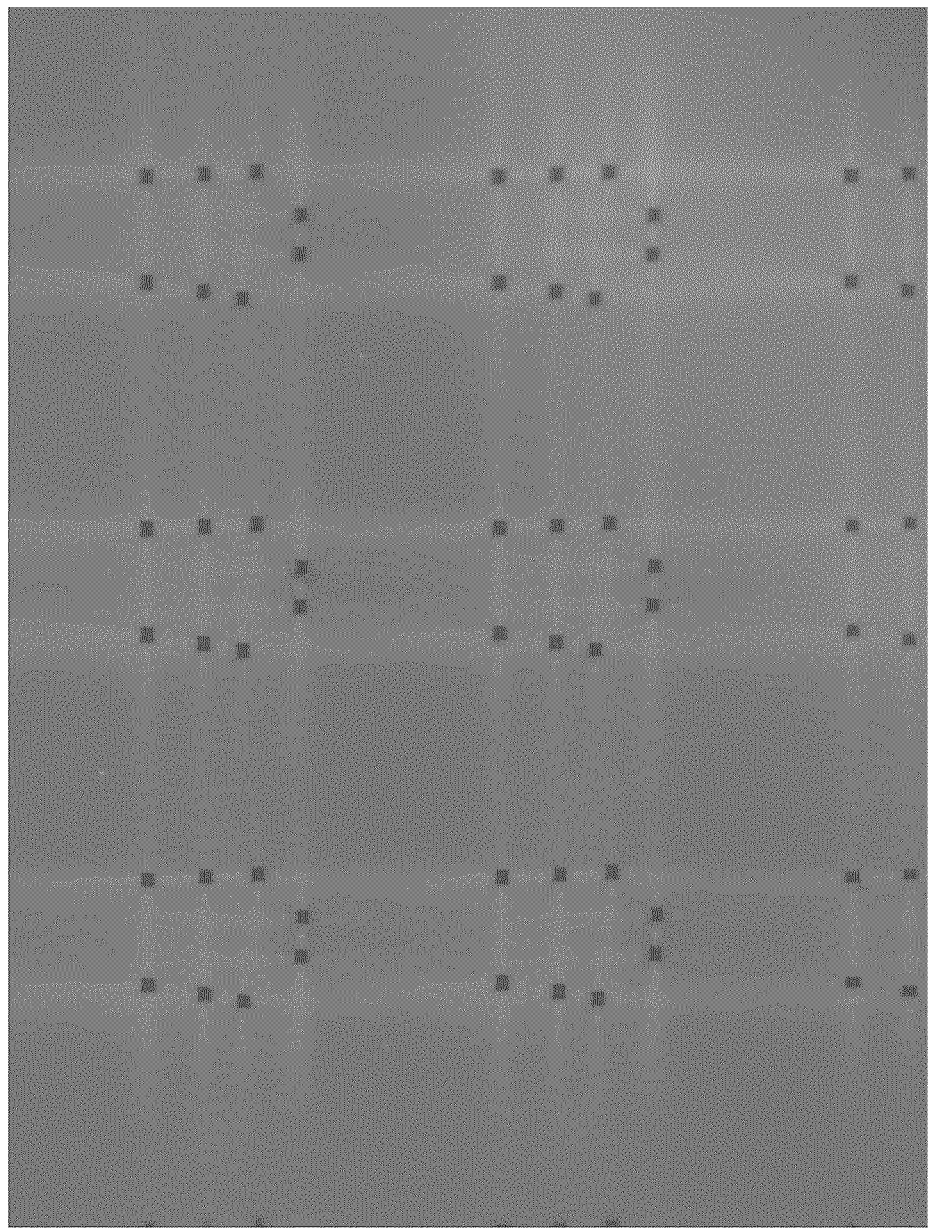

As shown in FIGS. 6A-6C, arrays of "L" shapes can be formed, with the "L" shape being formed by a single pen tip. To image the results of the lithographic experiment, for example, the resist coated substrate was developed followed by metal evaporation and resist removal to generate dot features. The relative positions of the dots from "L" to "L" represents the relative position of the tips 14 in the array. The diameter of each dot can be modulated by a number of lithographic parameters including, for example, exposure time, resist material type, and photosensitive layer 20 thickness.

Another factor contributing to BPL resolution is the tip aperture 18 size, which controls the area of the resist which is exposed to light from the tip. Referring to FIG. 4A, with a near UV light or halogen light source and conventional photolithography conditions, dot sizes close to and below the light diffraction limit, of about 200 nm (FIG. 4A inset) can be created. The dot pattern of FIG. 4A was generated using a radiation having a wavelength of about 380 nm to about 420 nm. Without intending to be bound by any particular theory, it is believed that this small feature size may be attributed to near-field effects at the point-of-contact between the tip and surface. Even though the aperture 18 used to create the dots of FIG. 4A is 500 nm, the contact area is much smaller, acting like a light pipe. Further optimization of the photolithography conditions can include, for example, using deep-UV illumination, thinner resist layers, and high resolution resist materials, which may improve BPL resolution down to the sub-100 nm range.

Large arrays of dots can be made simultaneously by moving the array of the surface with a piezo stage while illuminating the tip array 10 from the back side of the tips 14, for example, through the tip substrate layer 12. As shown in FIGS. 4B and 4C, 10×10 gold dot arrays with a feature spacing of 6 μm can be generated. The dot arrays were generated using 90% maximum power light intensity, a 20 second exposure time. The features have a diameter of 750±80 nm. The radiation can be kept on during the entire patterning process. Accordingly, the lateral and vertical movement of the tip array 10 is done rapidly to minimally expose the resist areas that are not intended for patterning. For example, the tip array 10 movement across the sample can be done in a range of about 10 μm/s to about 100 μm/s. For example, the minimum rate of movement of the tip array 10 across the substrate can be about 10, 20, 30, 40, 50, 60, 70, 80, 90, or 100 μm/s. For example, the maximum rate of movement of the tip array 10 across the substrate can be about 10, 20, 30, 40, 50, 60, 70, 80, 90, or 100 μm/s. Using a tip array 10 having 15,000 tips 14, 15,000 patterns can be simultaneously generated in about 30 minutes (for a total of 1.5 million features).

Figure 5A:
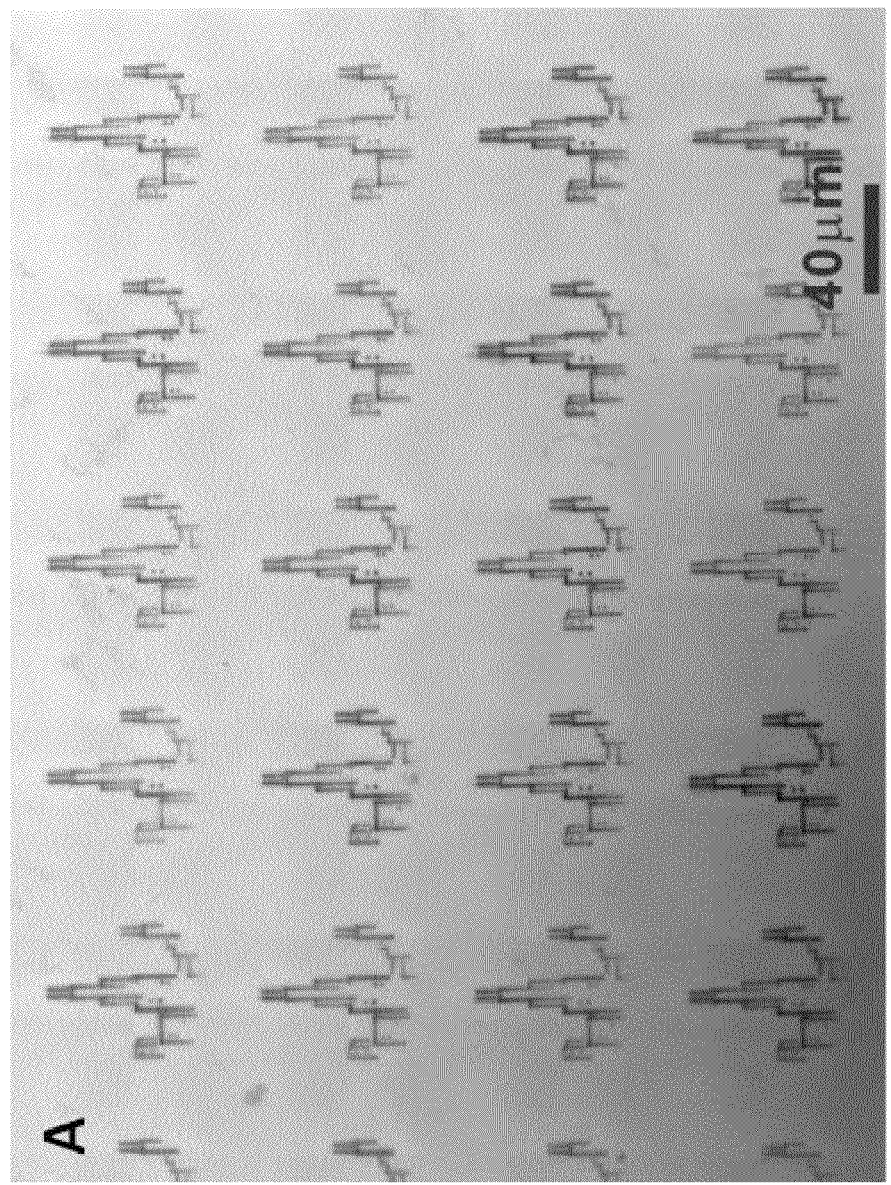
FIG. 5A is an optical developed photoresist pattern of a representative region of approximately 15,000 miniaturized duplicates of the Chicago skyline made by beam pen lithography.
Figure 5B:
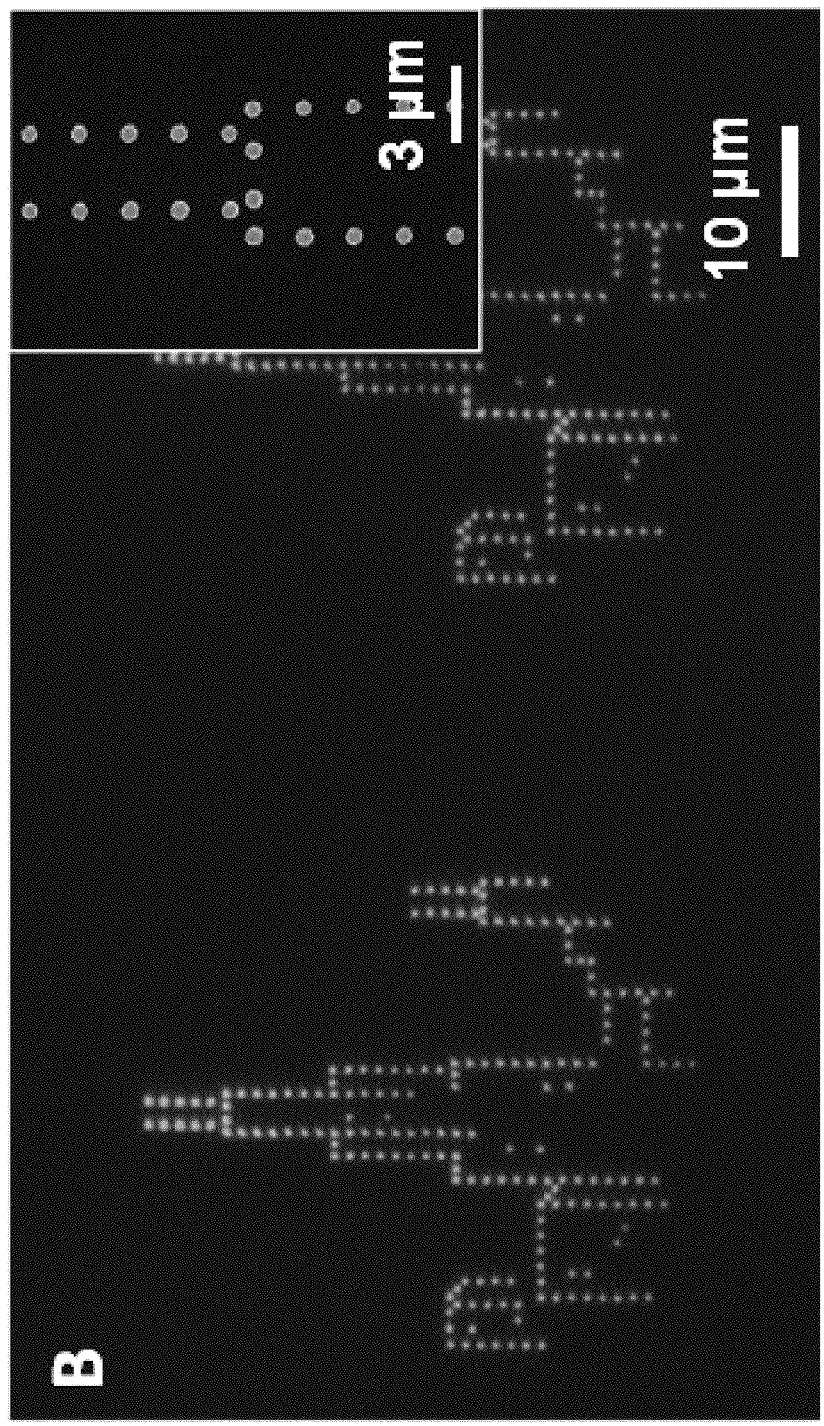
FIG. 5B is a zoom-in optical image of a representative replica of FIG. 5A. The inset shows a magnified SEM image of the dots.

As shown in FIGS. 5A and 5B, BPL was used to create 15,000 replicas of a pattern of the Chicago skyline comprised of 182 dots (FIG. 5A). The tip array 10 used to create the pattern had 500 nm diameter apertures. These structures were created by holding the pen array at each spot for about 20 s and traveling between spots at a speed of 60 μm/s. The dots are 450±70 nm in diameter and 600 nm apart (FIG. 5B).

The individual tips 14 within a BPL array can be addressed by selective illumination. For example, patterning can be achieved with the illumination of fewer than all of the tips 14 in the array, for example with one or a selected plurality of the tips 14 in the tip array 10. Selective illumination of the tips 14 can be performed, for example, by selectively focusing light through the microscopic bases of each tip. The tip array 10 can also include one or more spatial light modulators capable of blocking certain tips 14 from exposure to the light. The spatial light modulators can be static and/or dynamically controllable. For example, the spatial light modulates can be shutters. The spatial light modulators can be formed using a variety of materials, including, for example, liquid crystals. The spatial light modulators can be, for example, a mask, which is not dynamically controllable. The spatial light modulators can be placed or formed as a part of the tip substrate layer 12. Because the base of the tips 14 has edge lengths on the order of microns, the spatial light modulators need not be created on the nanoscale in order to result in sub-micron sized indicia. Rather it is the channeling of the radiation through the transparent polymer and the aperture 18 that allows for the sub-micron patterning. Tip addressability has been a major challenge for SPL methods. With passive arrays, one simply achieves duplication—each tip does exactly what the other tips 14 do. Many different methods of actuation have been evaluated with limited success, especially where lithography is the primary goal. Thermal, mechanical, electrical and magnetic actuation, all have been studied. With BPL, the radiation can be used as a convenient method to achieve multiplexed addressability of each tip within a complex and large array.

Referring FIGS. 7A-8D, for example, one can take the tip array 10 and use a photo mask, for example, a Cr photo mask, to cover all of the pyramid bases that one wants to turn off in a BPL experiment. Under homogeneous illumination, each active tip in the array can be used to fabricate repeat arbitrary patterns (such as letters of "NU" with 29 uniform dots). When the radiation source was illuminated on selected BPL tips 14 (e.g. areas corresponding to letters "U"), only those tips 14 under illumination can channel energy to the substrate and expose the resist layer, while no patterns resulted from other area without illumination, although all of the tips 14 made contacts with the substrate simultaneously, (FIG. 4B). This approach allows for two orthogonal levels of control, using selective illumination for tip-attenuation and tip movement. When coupled with spatial light modulator, each tip can be individually addressed to fabricate different patterns. For example, a portion of the tips 14 in a tip array 10 can be selectively illuminated and first pattern can be formed. The tip array 10 can then be shifted and a second pattern can be formed. The tip array 10 can be shifted, for example, a distance at least equal to the tip pitch to form with the second pattern step a variety of different patterns on the substrate. For example, as a result of the selective illumination of the tips 14, regions of the substrate would include only the first pattern, only the second pattern, or a combination of both patterns.

The features that can be patterned range from sub-100 nm to 1 mm in size or greater, and can be controlled by altering the exposure time and/or the contacting pressure of the tip array 10.

The BPL tip arrays can exhibit pressure dependence which results from the compressible nature of the polymer used to form the tip array 10. Indeed, the microscopic, preferably pyramidal, tips 14 can be made to deform with successively increasing amounts of applied pressure, which can be controlled by simply extending the piezo in the vertical direction (z-piezo). The controlled deformation of the tip array 10 can be used as an adjustable variable, allowing one to control tip-substrate contact area and resulting feature size. The pressure of the contact can be controlled by the z-piezo of a piezo scanner. The more pressure (or force) exerted on the tip array 10, the larger the feature size. Thus, any combination of contacting time and contacting force/pressure can provide a means for the formation of a feature size from about 30 nm to about 1 mm or greater. Within the pressure range allowed by z-piezo extension of about 5 to about 25 μm, one can observe a near linear relationship between piezo extension and feature size at a fixed contact time of 1 s. The substrate layer of the tip arrays can deform before deformation of the tips 14 occurs, which can offer a buffering provides extra tolerance in bringing all of the tips 14 in contact with the surface without tip deformation and significantly changing the intended feature size. The contacting pressure of the tip array 10 can be about 10 MPa to about 300 MPa.

At very low contact pressures, such as pressures of about 0.01 to about 0.1 g/cm$^2$ for the preferred materials described herein, the feature size of the resulting indicia is independent of the contacting pressure, which allows for one to level the tip array 10 on the substrate surface without changing the feature size of the indicia. Such low pressures are achievable by 0.5 μm or less extensions of the z-piezo of a piezo scanner to which a tip array 10 is mounted, and pressures of about 0.01 g/cm$^2$ to about 0.1 g/cm$^2$ can be applied by z-piezo extensions of less than 0.5 μm. This "buffering" pressure range allows one to manipulate the tip array 10, substrate, or both to make initial contact between tips 14 and substrate surface without compressing the tips 14, and then using the degree of compression of tips 14 (observed by changes in reflection of light off the inside surfaces of the tips 14) to achieve a uniform degree of contact between tips 14 and substrate surface. This leveling ability is important, as non-uniform contact of the tips 14 of the tip array 10 can lead to non-uniform indicia. Given the large number of tips 14 of the tip array 10 (e.g., 11 million in an example provided herein) and their small size, as a practical matter it may be difficult or impossible to know definitively if all of the tips 14 are in contact with the surface. For example, a defect in a tip or the substrate surface, or an irregularity in a substrate surface, may result in a single tip not making contact while all other tips 14 are in uniform contact. Thus, the disclosed methods provide for at least substantially all of the tips 14 to be in contact with the substrate surface (e.g., to the extent detectable). For example, at least 90%, at least 95%, at least 96%, at least 97%, at least 98%, or at least 99% of the tips 14 will be in contact with the substrate surface.

The leveling of the tip array 10 and substrate surface with respect to one another can be assisted by the transparent, or at least translucent nature of the tip array 10 and tip substrate layer 12, which allow for detection of a change in reflection of light that is directed from the top of the tip array 10 (i.e., behind the base of the tips 14 and common substrate) through to the substrate surface. The intensity of light reflected from the tips 14 of the tip array 10 increases upon contact with the substrate surface (e.g., the internal surfaces of the tip array 10 reflect light differently upon contact). By observing the change in reflection of light at each tip, the tip array 10 and/or the substrate surface can be adjusted to effect contact of substantially all or all of the tips 14 of the tip array 10 to the substrate surface. Thus, the tip array 10 and common substrate preferably are translucent or transparent to allow for observing the change in light reflection of the tips 14 upon contact with the substrate surface. Likewise, any rigid backing material to which the tip array 10 is mounted is also preferably at least transparent or translucent.

The contacting time for the tips 14 can be from about 0.001 seconds to about 60 seconds. For example, the minimum contact time can be about 0.001, 0.01, 0.1, 1, 10, 20, 30, 40, 50, or 60 seconds. For example, the maximum contact time can be about 0.001, 0.01, 0.1, 1, 10, 20, 30, 40, 50, or 60 seconds. The contacting force can be controlled by altering the z-piezo of the piezo scanner or by other means that allow for controlled application of force across the tip array 10.

The substrate surface can be contacted with a tip array 10 a plurality of times, wherein the tip array 10, the substrate surface or both move to allow for different portions of the substrate surface to be contacted. The time and pressure of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

The indicia resulting from the disclosed methods have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 μm, about 10 nm to about 100 μm, about 50 nm to about 100 μm, about 50 nm to about 50 μm, about 50 nm to about 10 μm, about 50 nm to about 5 μm, or about 50 nm to about 1 μm. Features sizes can be less than 1 μm, less than about 900 nm, less than about 800 nm, less than about 700 nm, less than about 600 nm, less than about 500 nm, less than about 400 nm, less than about 300 nm, less than about 200 nm, less than about 100 nm, or less than about 90 nm.

System for Beam Pen Lithography

A system for BPL can include a radiation source for emitting a radiation in a path and a tip array as disclosed herein disposed in the path with the radiation being incident upon the tip substrate layer, such that the radiation is emitted through the aperture-exposed tip ends of the tips. The system can further include a substrate stage disposed for selective contact with the tip array. The substrate stage can be, for example, a piezo stage. The tip array can optionally be operatively coupled to the radiation source and/or the substrate stage to perform a patterning method described herein. The apparatus can also include one or more spatial light modulators disposed in the radiation path between the radiation source and the tip array, for selective illumination of individual tips 14 in the array. For example, the system can include an array of spatial light modulators that are individually and dynamically controllable to selectively reflect the incident radiation or allow it to pass to the tip substrate layer and tip(s). The spatial light modulators can be coupled to the BPL tip array 10. For example, the spatial light modulators can be disposed on the tip substrate layer 12 of the tip array 10.

EXAMPLES

Fabrication of Masters of Polymer Pen Arrays:

Shipley1805 (MicroChem, Inc.) photoresist was spin-coated onto gold thin film substrates (10 nm Cr adhesion layer with 100 nm of Au thermally evaporated on a pre-cleaned oxidized Si <100> wafer). Square well arrays were fabricated by photolithography using a chrome mask. The photoresist patterns were developed in an MF319 developing solution (MicroChem, Inc.), and then exposed to $O_2$ plasma for 30 s (200 mTorr) to remove the residual organic layer. Subsequently, the substrates were placed in gold (Type TFA, Transene) and chromium (Type 1020, Transene) etching solutions, respectively. Copious rinsing with MiliQ water was required after each etching step to clean the surface. The photoresist was then washed away with acetone to expose the gold pattern. The gold patterned substrate was placed in a KOH etching solution (30% KOH in $H_2O$:IPA (4:1 v/v)) at 75° C. for ~25 min with vigorous stirring. The uncovered areas of the Si wafer were etched anisotropically, resulting in the formation of recessed pyramids. The remaining Au and Cr layers were removed by wet chemical etching. Finally, the pyramid master was modified with 1H,1H,2H,2H-perfluoro-decyltrichlorosilane (Gelest, Inc.) by gas phase silanization.

Fabrication of BPL Tip Array:

Hard PDMS (h-PDMS) (1,2) was used for fabricating the polymer pen arrays. The h-PDMS was composed of 3.4 g of vinyl-compound-rich prepolymer (VDT-731, Gelest) and 1.0 g of hydrosilane-rich crosslinker (HMS-301). Preparation of polymers typically required the addition of 20 ppm w/w platinum catalyst to the vinyl fraction (platinumdivinyltetramethyldisiloxane complex in xylene, SIP 6831.1 Gelest) and 0.1% w/w modulator to the mixture (2,4,6,8-tetramethyltetravinylcyclotetrasiloxane, Fluka). The mixture was stirred, degassed, and poured on top of the polymer pen array master. A pre-cleaned glass slide (VWR, Inc.) was then placed on top of the elastomer array and the whole assembly was cured at 70° C. overnight. The polymer pen array was carefully separated from the pyramid master.

The entire array, including tips 14, is cleaned by oxygen plasma and then covered with a layer gold by thermal evaporation methods (~80 nm with a 5 nm Ti adhesion layer). The tip array 10 was then brought in contact with a glass slide coated with poly(methyl methacrylate) (PMMA), a sticky material, which subsequently removed the Au/Ti layer from the PDMS tips 14, defining the aperture 18 and exposing the underlying transparent PDMS.

Patterning Using Beam Pen Lithography:

A Si/SiO$_2$ surface was first spin-coated with a layer of hexamethyl disilazane at about 4000 rmp for about 40 seconds, followed by spin-coating a layer of SHIPLEY 1805 (pre-diluted with propylene glycol monomethyl ether acetate, MicroChem. Inc.) at about 4000 rpm for about 40 seconds. The chip was then baked at a hot plate at about 110° C. for about 5 minutes before being used as a substrate.

The beam pen tip array 10 was then brought into contact with the substrate using a UV photo-aligner (Model Q2000). The substrate was then exposed to an illumination source by illuminating the top surface of the tip array 10 with a halogen light source. The light source traveled through the tips 14 of the array to expose portions of the substrate. Typical illumination time was in a range of about 0.5 seconds to about 1 second. Exposure was followed by pattern developing in an MF319 developing solution (MicroChem. Inc.). The illumination process was performed on a Park (XEP, Park Systems Co., Suwon, Korea) AFM platform. For selected-area illumination, conventional quartz masks with different shadow shapes (such as the letters of "NU") were placed between the light source and the tip arrays. As shown in FIG. 4, this results in the formation of patterns on the substrate in the shape of the quartz mask.

The foregoing describes and exemplifies the invention but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

All patents, publications and references cited herein are hereby fully incorporated by reference. In case of conflict between the present disclosure and incorporated patents, publications and references, the present disclosure should control.

REFERENCES

1. T. Ito, S. Okazaki, *Nature* 406, 1027 (2000).
2. C. A. Mirkin, *ACS Nano* 1, 79 (2007).
3. B. D. Gates et al., *Chem. Rev.* 105, 1171 (2005).
4. M. Qi et al., *Nature* 429, 538 (2004).
5. M. Geissler, Y. Xia, *Adv. Mater.* 16, 1249 (2004).
6. E. Abbé, *Arch. Mikrosk. Anat. Entwichlungsmech.* 9, 413 (1873).

7. T. F. Scott et al., *Science* 324, 913 (2009).
8. L. Li et al., *Science* 324, 910 (2009).
9. T. L. Andrew, H. Y Tsai, R. Menon, *Science* 324, 917 (2009).
10. H. I. Smith, *J. Vac. Sci. Technol. B* 14, 4318 (1996).
11. R. Menon, A. Patel, D. Gil, H. I. Smith, *Mater. Today* 8, 26 (2005).
12. M. D. Levenson, N. S. Viswanathan, R. A. Simpson, *IEEE Trans. Electr. Dev.* 29, 1828 (1982).
13. R. D. Piner, J. Zhu, F. Xu, S. Hong, C. A. Mirkin, *Science* 283, 661 (1999).
14. K. Salaita, Y. H. Wang, C. A. Mirkin, *Nat. Nanotech.* 2, 145 (2007).
15. A. Naber, H. Kock, H. Fuchs, *Scanning* 18, 567 (1996).
16. J. W. Kingsley, S. K. Ray, A. M. Adawi, G. J. Leggett, D. G. Lidzey, *App. Phys. Lett.* 93, 213103 (2008).
17. G. J. Leggett, *Chem. Soc. Rev.* 35, 1150 (2006).
18. S. S. Choi, et al., *J. Kor. Phys. Soc.* 45, 1659 (2004).
19. F. Huo et al., *Science* 321, 1658 (2008).
20. D. Qin, Y. Xia, A. J. Black, G. M. Whitesides, *J. Vac. Sci. Technol. B* 16, 98 (1998).
21. D. Qin, Y. Xia, and G. M. Whitesides, *Adv. Mat.* 9, 407 (1997).
22. Z. Zheng et al., *Angew. Chem. Int. Ed.* 48, 7626 (2009).
23. Materials and methods are available as supporting material on *Science* Online.
24. Vettiger, P. et al. *IBM J. Res. Develop.* 44, 323 (2000).
25. X. Wang, et al. *J. Vac. Sci. Technol. B* 22, 2563 (2004).
26. D. Bullen and C. Liu, *Sens. Actuators A* 125, 504 (2006).
27. D. Bullen, et al. *Appl. Phys. Lett.* 84, 789 (2004).

What is claimed is:

1. A tip array comprising:
   a tip substrate layer comprising a first surface and an oppositely disposed second surface;
   a plurality of tips fixed to the first surface, the tips each comprising a tip end disposed opposite the first surface, the tip substrate layer and the plurality of tips being formed from an at least translucent and deformable material, the tip substrate layer and the plurality of tips being formed from the same material, the tips having a radius of curvature of less than 1 µm, wherein the tips are arranged in a pre-determined pattern extending in at least two dimensions;
   a blocking layer coated on the plurality of tips and the first surface; and
   a plurality of apertures defined in the blocking layer exposing the tip ends of the plurality of tips,
   wherein the tip array is configured to generate a near field optical effect when brought in proximity with a substrate, and deformation of the tips when in contact with the substrate provides a change in the size of the near-field optical effect.

2. The tip array of claim 1, wherein the tips are arranged in a regular periodic pattern.

3. The tip array of claim 1, wherein the tips are identically-shaped.

4. The tip array of claim 1, wherein the tips are pyramidal.

5. The tip array of claim 1, wherein the thickness of the tip substrate layer is 50 µm to 100 µm.

6. The tip array of claim 1, further comprising an at least translucent rigid support adhered to the second surface of the substrate layer.

7. The tip array of claim 1, wherein the tip substrate layer and tips have a combined thickness of less than 200 µm.

8. The tip array of claim 1, wherein the blocking layer is a metal.

9. The tip array of claim 1, wherein the at least translucent material comprises a polymer.

10. The tip array of claim 1, wherein the at least translucent material comprises a crosslinked polymer or a polymer gel.

11. The tip array of claim 1, wherein the at least translucent material is elastomeric.

12. The tip array of claim 1, wherein the at least translucent material is reversibly deformable.

13. The tip array of claim 1, wherein the at least translucent material is substantially transparent.

14. The tip array of claim 1, wherein the at least translucent material comprises polydimethylsiloxane (PDMS).

15. The tip array of claim 1, wherein the PDMS comprises a trimethylsiloxy terminated vinylmethylsiloxane-dimethysiloxane copolymer, a methylhydrosiloxane-dimethylsiloxane copolymer, or a mixture thereof.

16. The tip array of claim 1, wherein the aperture has a diameter in a range of 30 nm to 5000 nm.

17. The tip array of claim 1, wherein the plurality of tips are disposed with a tip-to-tip spacing in a range of 1 µto 10 mm.

18. The tip array of claim 1, wherein each tip has a radius of curvature of less than 0.2 µm.

19. The tip array of claim 1, wherein the tip substrate layer and tips comprise a polymer having a compression modulus of 10 MPa to 300 MPa.

20. The tip array of claim 1, further comprising at least one spatial light modulator disposed on the tip substrate layer.

21. The tip array of claim 20, wherein the spatial light modulator is dynamically controllable.

22. The tip array of claim 1, further comprising an array of spatial light modulators disposed on the tip substrate layer.

23. A method for sub-micron scale patterning, comprising:
   contacting a photosensitive substrate with a tip array of claim 1;
   irradiating at least one tip of the tip array with a radiation source, to transmit radiation through the tip and out the tip end; and
   exposing a portion of the photosensitive substrate with the transmitted radiation.

24. The method of claim 23, wherein the exposed area of the photosensitive substrate has a dot size (or line width) of less than 1µm.

25. The method of claim 23, comprising irradiating all of the tips in the tip array.

26. The method of claim 23, comprising selectively masking the tip substrate layer to selectively illuminating at least one tip.

27. The method of claim 23, further comprising moving the tip array, the substrate surface, or both after said contacting step and then repeating the contacting step.

28. The method of claim 24, wherein the dot size (or line width) is less than 100 nm.

29. The method of claim 23, comprising irradiating with radiation having a wavelength in a range of 10 nm to 500 nm.

30. The method of claim 23, wherein the photosensitive substrate comprises a photosensitive layer disposed on a substrate layer.

31. The method of claim 23, wherein the photosensitive substrate comprises a resist material.

32. The method of claim 23, further comprising developing the exposed photosensitive substrate to remove either the exposed portion of the photosensitive substrate or the non-exposed portion of the photosensitive substrate, applying a patterning material to the portion of the substrate in which the photosensitive substrate was removed; and removing the remaining portion of the photosensitive substrate to thereby leave an indicium.

33. The method of claim 32, wherein said indicium has a dot size (or line width) of less than 1 µm.

34. The method of claim 32, wherein the patterning material is a metal.

35. The method of claim 34, comprising applying the patterning material by metal evaporation.

36. A method of making a beam pen lithography tip array of claim 1, comprising:
providing tip array comprising a tip substrate layer comprising a first surface, an oppositely disposed second surface, a plurality of tips fixed to the first surface, the tips each comprising a tip end disposed opposite the first surface;
coating a blocking layer on the plurality of tips and the first surface; and
forming an aperture in the blocking layer at the tip ends of the tips by removing a portion of the blocking layer.

37. The method of claim 36, comprising forming the tip array by
providing a master comprising an array of recesses in a substrate separated by lands;
filling the recesses and covering the lands with a prepolymer mixture comprising a prepolymer and, optionally, a crosslinker;
curing the prepolymer mixture to form a transparent polymer structure;
separating the cured polymer structure from the master.

38. The method of claim 36, comprising removing the portion of the blocking layer by contacting the coated portion of polymer structure to a surface coated with an adhesive, and then moving the coated polymer structure away from the adhesive to separate an adhered portion of the blocking layer from the cured polymer structure.

39. The method of claim 36, comprising removing the portion of the blocking layer by coating the blocking layer with an adhesive; removing at least a portion of the adhesive by contacting the coated polymer structure to a surface, wherein upon removal of the polymer structure from the surface, the contacted portion of the adhesive remains on the surface to define an opening in the adhesive, exposing a portion of the blocking layer; and etching the exposed portion of the blocking layer and thereby exposing a portion of the polymer structure.

40. The method of claim 37, further comprising forming the recesses as pyramidal recesses by forming wells in the substrate and anisotropically wet-etching the substrate.

41. The method of claim 37, further comprising covering the filled and coated substrate with a planar glass layer prior to curing.

42. The method of claim 38 comprising use of an adhesive, wherein the adhesive is selected from the group consisting of PMMA, PEG, poly(acrylonitrile), and combinations thereof.

43. The method of claim 38 comprising use of an adhesive, comprising controlling the diameter of the aperture by controlling the contact pressure between the polymer structure and the surface.

44. A system for beam pen lithography, comprising:
a radiation source for emitting a radiation in a path;
a tip array of claim 1 disposed in the radiation path such that the radiation, when active, is incident upon the tip substrate layer; and
a substrate stage disposed for selective contacting of a substrate to the tip array.

45. The system of claim 44, wherein the substrate stage comprises a piezo stage.

46. The system of claim 44, further comprising at least one spatial light modulator disposed in the radiation path between the radiation source and the tip array.

47. The system of claim 46, further comprising an array of spatial light modulators disposed in the radiation path between the radiation source and the tip array.

48. The system of claim 47, wherein each spatial light modulator is individually controllable to selectively pass or reflect incident radiation from the radiation source.

49. The system of claim 46 comprising a plurality of spatial light modulators, wherein the spatial light modulators are dynamically controllable.

50. A tip array comprising:
a tip substrate layer comprising a first surface and an oppositely disposed second surface, the tip substrate layer being formed from an at least translucent substrate layer material that extends between the first surface and the second surface;
a plurality of tips fixed to the first surface, the tips each comprising a tip end disposed opposite the first surface, the plurality of tips being formed from an at least translucent and deformable tip material that extends from the first surface to the tip end, the tips having a radius of curvature of less than 1 µm, wherein the tips are arranged in a pre-determined pattern extending in at least two dimensions;
a blocking layer coated on the plurality of tips and the first surface; and
a plurality of apertures defined in the blocking layer exposing the tip ends of the plurality of tips,
wherein the tip array is configured to generate a near field optical effect when brought in proximity with a substrate, and deformation of the tips when in contact with the substrate provides a change in the size of the near-field optical effect.

* * * * *